United States Patent
Kurokawa et al.

(10) Patent No.: US 10,083,813 B2
(45) Date of Patent: Sep. 25, 2018

(54) MULTICOLUMN CHARGED PARTICLE BEAM EXPOSURE APPARATUS

(71) Applicant: INTEL CORPORATION, Santa Clara, CA (US)

(72) Inventors: Masaki Kurokawa, Tokyo (JP); Takamasa Sato, Tokyo (JP); Shinichi Kojima, Tokyo (JP); Akio Yamada, Tokyo (JP)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/461,829

(22) Filed: Mar. 17, 2017

(65) Prior Publication Data

US 2017/0323760 A1 Nov. 9, 2017

(30) Foreign Application Priority Data

May 9, 2016 (JP) ................................. 2016-093801

(51) Int. Cl.
| | |
|---|---|
| *H01J 3/14* | (2006.01) |
| *H01J 37/147* | (2006.01) |
| *H01J 37/317* | (2006.01) |
| *H01J 37/24* | (2006.01) |

(52) U.S. Cl.
CPC .......... *H01J 37/147* (2013.01); *H01J 37/241* (2013.01); *H01J 37/3177* (2013.01); *H01J 2237/141* (2013.01); *H01J 2237/152* (2013.01); *H01J 2237/1504* (2013.01); *H01J 2237/1526* (2013.01); *H01J 2237/20285* (2013.01)

(58) Field of Classification Search
None
See application file for complete search history.

(56) References Cited

U.S. PATENT DOCUMENTS 5,469,017 A * 11/1995 Perreaut .................. H01J 29/56
  313/421
5,969,477 A   10/1999 Haraguchi et al.
(Continued)

FOREIGN PATENT DOCUMENTS

| JP | 2002-175968 | 6/2002 |
| JP | 2005-251440 | 9/2005 |

(Continued)

OTHER PUBLICATIONS

Yamada Akio et al: "Electron beams in individual column cells of multicolumn cell system", Journal of Vacuum Science and Technology: Part B, AVS / AIP, Melville, New York, NY, US, vol. 26, No. 6, Dec. 1, 2008 (Dec. 1, 2008), pp. 2025-2031, XP012114410, ISSN: 1071-1023, DOI: 10.1116/1.2976603.

(Continued)

*Primary Examiner* — Andrew Smyth

(57) ABSTRACT

A multicolumn charged particle beam exposure apparatus includes a plurality of column cells which generate charged particle beams, and the column cell includes a yoke which is made of a magnetic material and generates a magnetic field of a predetermined intensity distribution around an optical axis of the column, and a coil which is wound around the yoke. The coil includes a plurality of divided windings, which are driven by different power sources.

11 Claims, 13 Drawing Sheets

(56) References Cited

U.S. PATENT DOCUMENTS

| | | | |
|---|---|---|---|
| 2003/0183773 A1* | 10/2003 | Haraguchi | B82Y 10/00 250/396 ML |
| 2005/0214958 A1 | 9/2005 | Nakasuji et al. | |
| 2008/0315095 A1 | 12/2008 | Nakasuji et al. | |
| 2011/0148297 A1 | 6/2011 | Yasuda et al. | |
| 2013/0011796 A1 | 1/2013 | Hirata | |
| 2014/0264062 A1 | 9/2014 | Adamec | |
| 2015/0200074 A1 | 7/2015 | Hamaguchi et al. | |

FOREIGN PATENT DOCUMENTS

| | | | | |
|---|---|---|---|---|
| JP | 2013-016744 | | 1/2013 | |
| JP | 2013016744 A | * | 1/2013 | H01J 37/3177 |
| JP | 2014-183047 | | 9/2014 | |
| JP | 2015-133400 | | 7/2015 | |

OTHER PUBLICATIONS

Extended European Search Report for European Patent Application No. 17 161 755.8, issued by the European Patent Office dated Nov. 21, 2017.

* cited by examiner

US 10,083,813 B2

MULTICOLUMN CHARGED PARTICLE BEAM EXPOSURE APPARATUS

CROSS-REFERENCE TO RELATED APPLICATIONS

This application is based upon and claims the benefit of priority of the prior Japanese Patent Application No. 2016-093801, filed on May 9, 2016, the entire contents of which are incorporated herein by reference.

FIELD

The embodiments discussed herein are related to a multicolumn charged particle beam exposure apparatus which includes a plurality of column cells that generate charged particle beams.

BACKGROUND

Charged particle beam exposure techniques have been conventionally known which form a fine pattern by using charged particle beams such as electron beams (for example, see Patent Document 1).

As one of such charged particle beam exposure techniques, a multicolumn charged particle beam exposure apparatus including a plurality of columns which generate charged particle beams has been also known (for example, see Patent Document 2).

The multicolumn charged particle beam exposure apparatus can perform the drawing of patters in a simultaneous and parallel manner using the plurality of columns, thereby significantly improving the speed of exposure process.

CITATION LIST

Patent Documents

Patent Document 1: Japanese Laid-open Patent Publication No. 2013-16744
Patent Document 2: Japanese Laid-open Patent Publication No. 2015-133400

SUMMARY

In the multicolumn charged particle beam exposure apparatus which includes a plurality of columns, a variation in characteristic among the charged particle beams from the respective columns may possibly appear because these columns are individually driven.

Therefore, an object is to provide a multicolumn charged particle beam exposure apparatus with a less variation in characteristic among the charged particle beams from the respective columns.

An aspect of the disclosure to be described later provides a multicolumn device including a plurality of column cells configured to generate charged particle beams; electromagnetic elements provided in the respective column cells; coils provided in the respective column cells and each including a plurality of divided windings configured to excite the corresponding electromagnetic element; and wiring connecting different current source circuits to the respective divided windings belonging to one of the coils.

Another aspect provides a multicolumn charged particle beam exposure apparatus including a plurality of column cells configured to generate charged particle beams; electromagnetic elements provided in the respective column cells; coils provided in the respective column cells and each including a plurality of divided windings configured to excite the corresponding electromagnetic element; and wiring connecting different current source circuits to the respective divided windings belonging to one of the coils; a stage unit on which a sample is to be placed; a column controller configured to control an operation of the multicolumn device; and a stage controller configured to control an operation of the stage unit.

With the multicolumn charged particle beam exposure apparatus according to the aspects described above, a decrease in the influence due to the variation in output characteristics of the individual power sources results in a small variation in characteristic between the charged particle beams for the respective columns.

DESCRIPTION OF EMBODIMENT

Hereinafter, the present invention will be explained using embodiments of the invention. However, the following embodiments are not intended to limit the scope of the invention. Moreover, all the combinations of characteristics explained in the embodiments are not necessarily required for solving the problems of the invention.

Figure 1:
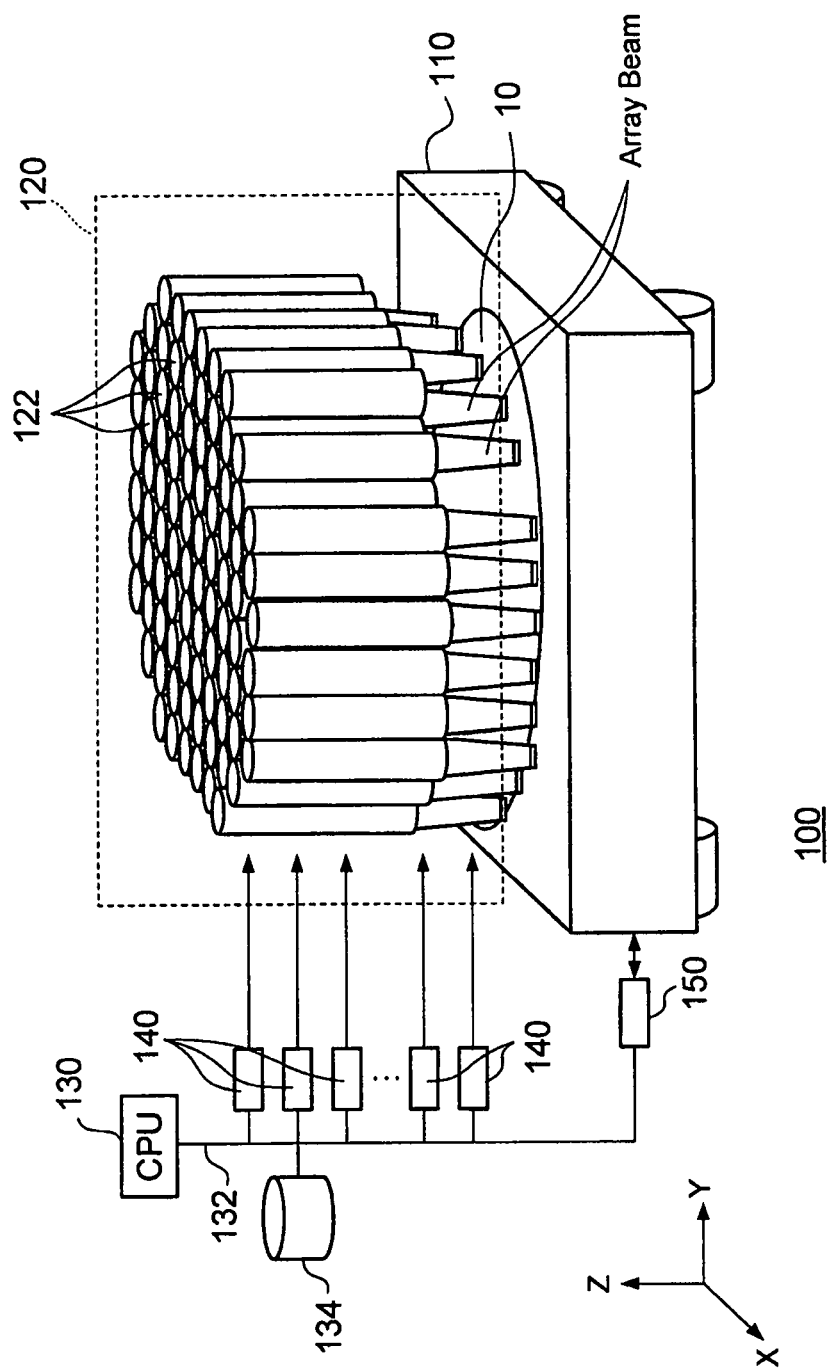
FIG. 1 illustrates a configuration example of an exposure apparatus 100 according to an embodiment.

FIG. 1 illustrates a configuration example of an exposure apparatus 100 according to this embodiment. The exposure apparatus 100 irradiates an object on a sample with charged particle beams to expose various patterns. Although the exposure apparatus. 100 is not specially limited, for example, the exposure apparatus 100 can form a cut pattern or a via pattern by irradiating a line pattern on the sample which is formed based on a grid set in advance with a charged particle beam having an irradiation position and an irradiation range in accordance with the grid.

This exposure apparatus 100 is provided with one stage unit 110, a multicolumn device 120 which includes a plurality of column cells 122, one CPU 130, a plurality of column controllers 140 which respectively and individually control the plurality of column cells 122, and one stage controller 150.

The stage unit 110 has a sample 10 placed thereon, and moves the sample 10 within an XY plane illustrated in FIG. 1. Here, as an example, the sample 10 is a substrate in which a line pattern is formed with a conductor such as metal on a surface of a semiconductor wafer formed of silicon and the like.

The exposure apparatus 100 according to this embodiment exposes a resist applied onto the line pattern for achieving fine processing (forming an electrode, a wiring, and/or a via, or the like) by cutting the line pattern, for example.

The multicolumn device 120 which includes the plurality of column cells 122 generates charged particle beams including electrons, ions, or the like, and irradiates the sample 10 placed on the stage unit 110 with the charged particle beams. In this embodiment, as an example, the multicolumn device 120 generates an electron beam EB will be explained. The number of the column cells 122 included in the multicolumn device 120 is 88, as an example. The 88 column cells 122 are disposed at approximately 30 mm pitches within the XY plane. The entire surface of the sample 10, which is a semiconductor wafer having a diameter of an approximately 300 mm, placed on the stage unit 110 is irradiated with the electron beam EB that is generated from at least one column cell 122, within a movable range of the stage unit 110.

Each column cell 122 generates an array beam including a plurality of electron beams EB which are arranged in a predetermined one-dimensional direction. A width fw of the entire array beam is 60 um, for example. The number of the electron beams EB included in the array beam is 4098, for example. The exposure apparatus 100 individually switches each of the plurality of electron beams EB included in the array beam between irradiating the sample 10 (ON state) or not irradiating (OFF state), therewith to expose a pattern onto the sample 10 while moving on the stage unit 110.

The CPU 130 controls an entire operation of the exposure apparatus 100. The CPU 130 may be a computer, a workstation, or the like having a function of an input terminal into which an operation instruction from a user. The CPU 130 is connected to the plurality of column controllers 140 which control the multicolumn device 120, and the stage controller 150 which controls the stage unit 110, via a bus 132. Each of the plurality of column controllers 140 individually controls the corresponding column cell 122, in response to a control signal or the like received from the CPU 130. Moreover, the column controllers 140 are connected to an external storage unit 134 via the bus 132, and send and receive data of the exposure pattern stored in the external storage unit 134.

Figure 2:
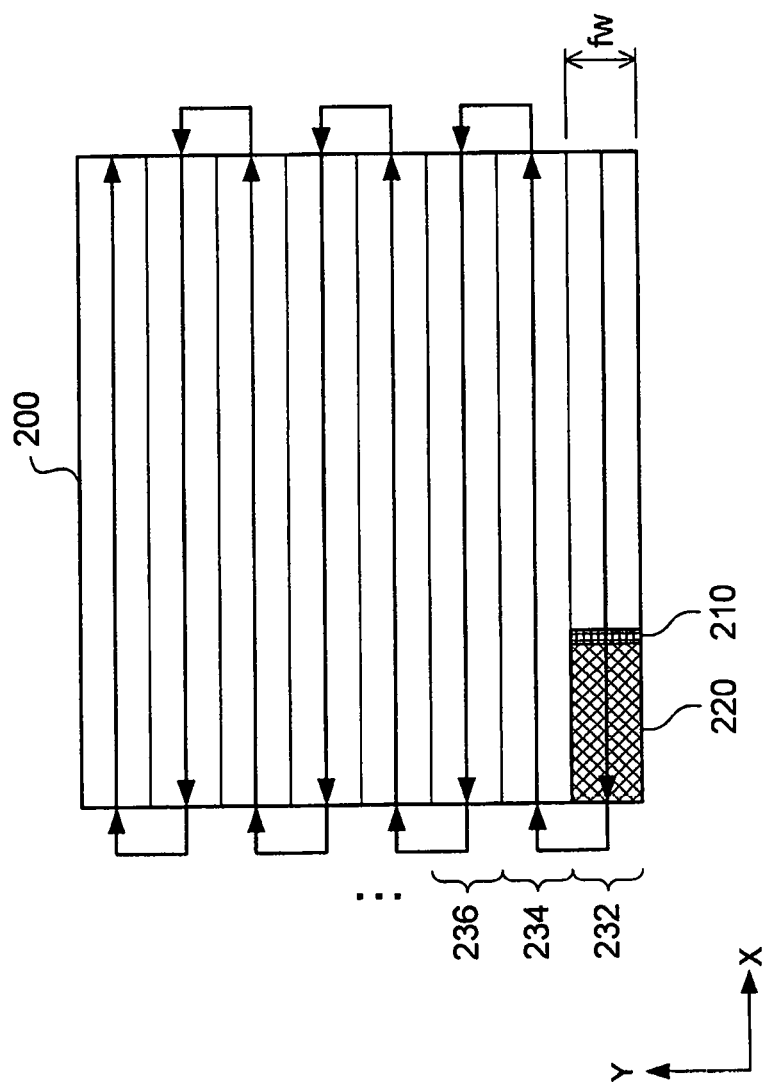
FIG. 2 illustrates an example of an irradiation allowable region 200 which is formed on a portion of a surface of a sample 10 by the exposure apparatus 100 by scanning electron beams according to this embodiment.

The stage controller 150 controls the stage unit 110 to move the sample 10 in a longitudinal direction of the line pattern formed on the surface of the sample 10. FIG. 2 illustrates an example of an irradiation allowable region 200 which is formed on a portion of the surface of the sample 10 by the exposure apparatus 100 scanning the electron beams EB according to this embodiment. The example indicates that the stage controller 150 moves the stage unit 110 in a −X direction which is the longitudinal direction of the line pattern.

An irradiation position 210 of an array beam generated by one column cell 122 is moved in a +X direction on the surface of the sample 10. With this, a band-shaped region 220 of the array beam is obtained as an irradiation allowable region of the electron beams EB. The stage controller 150 moves the stage unit 110 in an X direction by a predetermined distance to obtain a first frame 232 as an irradiation allowable region. The first frame 232 has a length of 30 mm in the X direction which is a movement direction of the stage unit 110, a width of 60 μm in a Y direction which is a beam width direction of the array beam, and an area of 30 mm×60 μm, as an example.

The stage controller 150 next moves the stage unit 110 in the −Y direction by the beam width fw of the array beam, and moves the stage unit 110 in the +X direction so as to make the stage unit 110 return by the distance set in advance having moved last time in the −X direction. With this, the irradiation position 210 of the array beam is moved in the −X direction on a portion of the surface of the sample 10 different from the first frame 232 to obtain a second frame 234 which has an approximately the same area as the first frame 232 and adjacent thereto in the +Y direction as an irradiation allowable region. Similarly, the stage controller 150 moves the stage unit 110 in the −Y direction by the beam width fw of the array beam and again moves the stage unit 110 in the −X direction by the distance set in advance to obtain a third frame 236 as an irradiation allowable region.

In this manner, the stage controller 150 causes the stage unit 110 to perform a reciprocating motion in the X direction which is the longitudinal direction of the line pattern formed in advance on the sample 10 to obtain a region set in advance in the surface of the sample 10 as the irradiation allowable region 200 of the array beam generated by one column cell 122. The stage controller 150 obtains a square region of 30 mm×30 mm as the irradiation allowable region 200 of the array beam generated by one column cell 122, as an example.

The exposure apparatus 100 concurrently exposes the entire surface of the sample 10 with the 88 column cells 122 which are disposed at approximately 30 mm pitches within the XY plane parallel with the surface of the sample 10. The exposure apparatus 100 provided with the plurality of column cells 122 exposes the entire surface of the sample 10 for a duration during which each column cell 122 exposes the square irradiation region 200 of 30 mm×30 mm, for example.

This allows the exposure apparatus 100 illustrated in FIG. 1 to significantly improve the throughput of exposure compared with an exposure apparatus which includes a single column cell 122. Moreover, the exposure apparatus 100 can prevent a significant decrease in throughput by increasing the number of the column cells 122 included in the multicolumn device 120 even when the sample 10 is a large-diameter semiconductor wafer or the like having a diameter exceeding 300 mm.

In the exposure apparatus 100 illustrated in FIG. 1, each of the plurality of column cells 122 which constitute the multicolumn device 120 includes an electromagnetic element in order to control the electron beams EB generated by the column cell 122. The column cell 122 includes an electromagnetic lens, which is an example of the electromagnetic element, for example, in order to converge or diverge the electron beams EB. Moreover, the column cell 122 includes an electromagnetic deflector, which is an example of the electromagnetic element, for example, in order to change the traveling direction of the electron beams EB. In addition, the column cell 122 includes an electromagnetic corrector, which is an example of the electromagnetic element, for example, in order to correct the aberration to focusing of the electron beams EB.

Note that, in the specification, it is assumed that the electromagnetic element indicates one element which causes a magnetic field to be generated in a predetermined direction and to act an electro-optical effect on the electron beams EB, and which is different from an electro-optical system configured by a plurality of electro-optical elements in combination.

Figure 3:
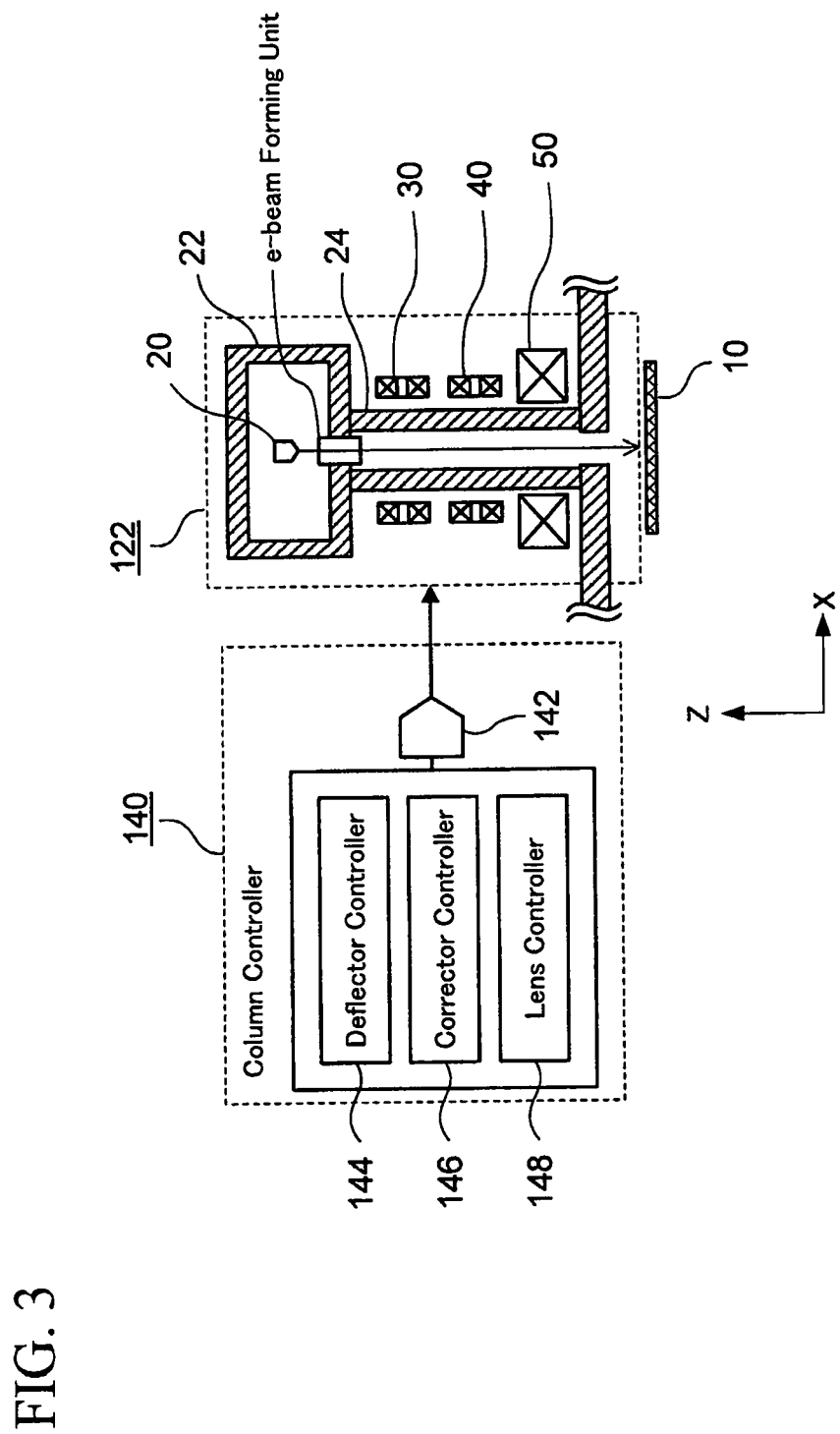
FIG. 3 illustrates a cross-sectional view illustrating a portion of a column cell 122 according to this embodiment, and a view illustrating a portion of a column controller 140 which controls the column cell 122.

FIG. 3 illustrates a cross-sectional view illustrating a portion of the column cell 122 according to this embodiment, and a view illustrating a portion of the column controller 140 which controls the column cell 122. FIG. 3 illustrates one column cell 122 extracted out of the plurality of column cells 122 which constitute the multicolumn device 120. The column cell 122 is provided with an electron source 20, a vacuum chamber 22, an electron beam forming unit, a vacuum partition wall 24, electromagnetic deflectors 30, electromagnetic correctors 40, and electromagnetic lenses 50. The electromagnetic deflector 30, the electromagnetic corrector 40, and the electromagnetic lens 50 are examples of electromagnetic elements each of which generates a magnetic field which controls the electron beams EB by feeding the current into a coil.

The electron source 20 is an example of a charged particle source that emits the electron beams EB. The electron source 20 emits an electron due to the electric field or the heat, applies the electric field set in advance to the emitted electron, and accelerates the electron in a direction of the sample 10 which is a −Z direction of FIG. 3 to output the electron as the electron beam EB. The electron source 20 may accelerate the electron beam EB by applying an acceleration voltage (as an example, 50 KV) set in advance. The electron source 20 may be provided on a normal perpendicular to the XY plane which is in parallel with the surface of the sample 10. The electron source 20 is installed in the interior of the vacuum chamber 22.

The electron beam forming unit forms the electron beam EB outputted from the electron source 20, for example, and forms an array beam including a plurality of electron beams EB which are arranged in the one-dimensional direction. The electron beam forming unit then performs a control of switching between causing the formed electron beam EB to be irradiated onto the sample 10 (ON state) or not to be irradiated (OFF state).

The vacuum partition wall 24 has a cylindrical shape in which a long and slender through hole is formed in a Z axis direction. The vacuum partition wall 24 has an end portion which may be brought into contact with the vacuum chamber 22 in which the electron source 20 is installed in the interior thereof. A contact surface of the vacuum partition wall 24 which is brought into contact with the vacuum chamber 22 forms a vacuum seal face. The vacuum partition wall 24 maintains a space in an inner side of the vacuum chamber 22 and a space in an inner side of the vacuum partition wall 24, in a vacuum state. The electron beam EB emitted from the electron source 20 passes through the space which is maintained in the vacuum state in the inner side of the vacuum partition wall 24, and reaches the sample 10.

The electromagnetic deflector 30 and the electromagnetic corrector 40 each generate a magnetic field in a direction substantially orthogonal to the −Z direction which is the traveling direction of the electron beam EB, in the space through which the electron beam EB passes. In a case where an electromagnetic element generates a magnetic field which changes the traveling direction of the electron beam EB as a whole, the electromagnetic element constitutes the electromagnetic deflector 30. In place of this case, in a case where an electromagnetic element generates a magnetic field which does not change the traveling direction of the electron beam EB as a whole but changes a focusing condition in a vertical direction and a transverse direction of the electron beam cross section, the electromagnetic element constitutes the electromagnetic corrector 40.

The electromagnetic lens 50 generates a magnetic field in a direction in substantially parallel with the −Z direction which is the traveling direction of the electron beam EB, in the space through which the electron beam EB passes. The magnetic field generated by the electromagnetic lens 50 distributes axially symmetric with respect to a lens axis through which the electron beam EB passes, and acts a lens effect on the electron beam EB.

The electromagnetic deflector 30, the electromagnetic corrector 40, and the electromagnetic lens 50 are respectively connected to a deflector controller 144, a corrector controller 146, and a lens controller 148, which are portions of the column controller 140, via a driving unit 142. The deflector controller 144, the corrector controller 146, and the lens controller 148 respectively set the deflection amount of the electromagnetic deflector 30, the correction amount of the electromagnetic corrector 40, and the lens intensity of the electromagnetic lens 50 in the driving unit 142, and output set values to the column cell 122.

The driving unit 142 receives the set values from the deflector controller 144, the corrector controller 146, and the lens controller 148. Then the driving unit 142 feeds the currents corresponding to the set values of the column controller 140 to coils which excite the electromagnetic deflector 30, the electromagnetic corrector 40, and the electromagnetic lens 50. With this, the electromagnetic deflector 30 which is provided in the column cell 122 corresponding to the column controller 140 deflects the electron beam EB with the predetermined deflection amount. The electromagnetic corrector 40 corrects the aberration of the electron beam EB with the predetermined correction amount. The electromagnetic lens 50 converges the electron beam EB with the predetermined lens intensity.

Examples of the configuration and the connection of coils which excites the electromagnetic element provided in the multicolumn device 120 will be explained. In the following explanation, a case where the electromagnetic element is the electromagnetic lens 50 will be explained in detail. Even in a case where the electromagnetic element is the electromagnetic deflector 30 or the electromagnetic corrector 40, the examples of the configuration and the connection of the coil similar to those of this embodiment is applicable to a coil which excites the electromagnetic deflector 30 or the electromagnetic corrector 40.

Figure 4:
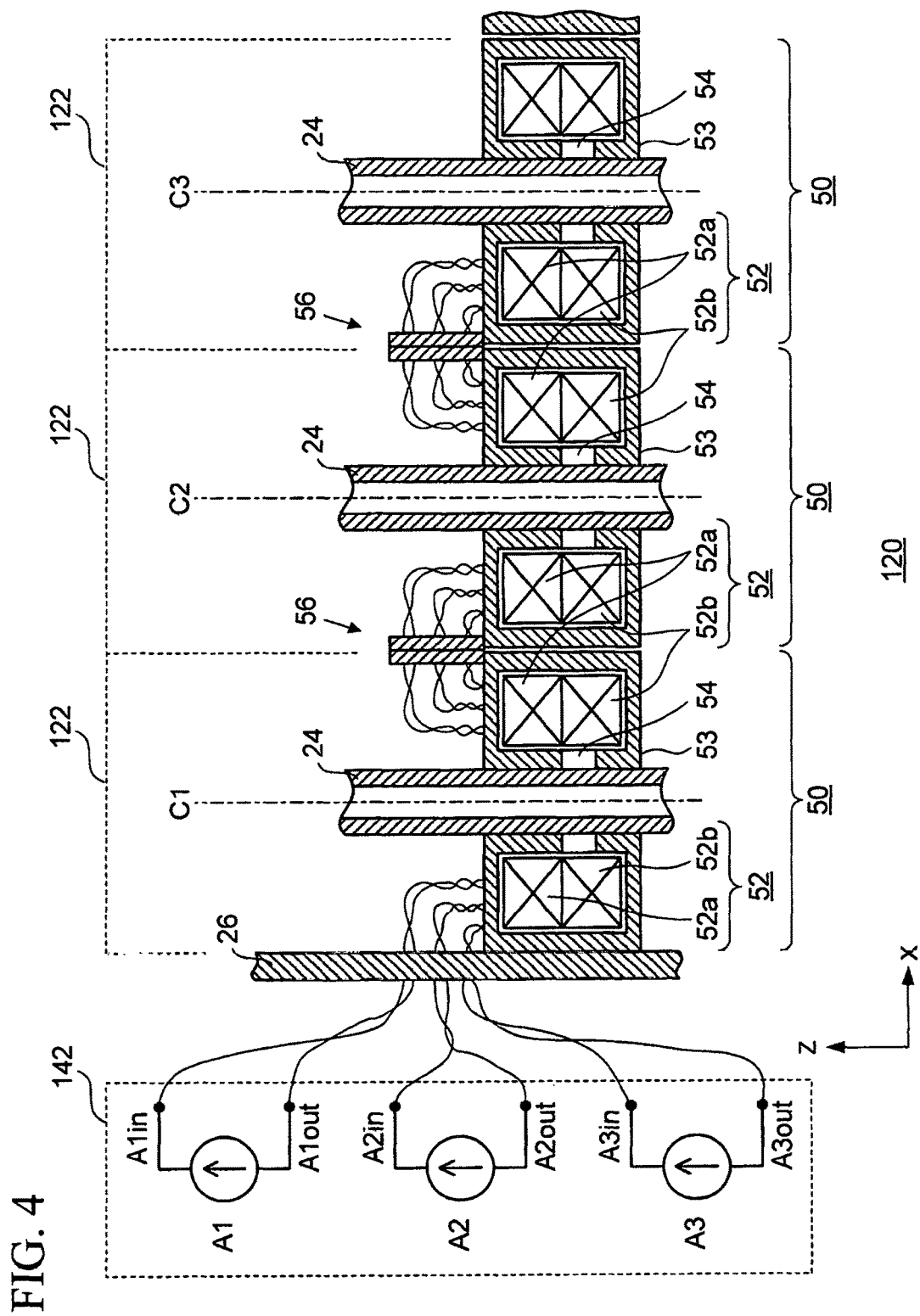
FIG. 4 is a cross-sectional view illustrating a configuration example of electromagnetic lenses 50 provided in a multicolumn device 120 according to this embodiment.

FIG. 4 is a cross-sectional view illustrating a configuration example of the electromagnetic lenses 50 provided in the multicolumn device 120 according to this embodiment. FIG. 4 illustrates an example in the embodiment in a case where three column cells 122 constitute a column group, out of the plurality of column cells 122 provided in the multicolumn device 120. Here, the column group is a group of columns which includes coils mutually connected to one another and includes a plurality of column cells 122.

FIG. 4 illustrates the electromagnetic lenses 50 provided in the three column cells 122 which constitute one column group. The electromagnetic lenses 50 respectively include lens axes C1, C2, and C3, which are indicated by dot-and-dash lines. It is assumed that the electromagnetic lenses 50 including the lens axes C1, C2, and C3 are respectively called a Lens C1, a Lens C2, and a Lens C3 when being distinguished. FIG. 4 illustrates a portion of a cross section in which the multicolumn device 120 is cut along a plane in parallel with an XZ plane which includes the lens axes C1, C2, and C3 of the electromagnetic lenses 50.

The electron beam passes through the interior of the through hole maintained in the vacuum state with the vacuum partition wall 24, along the lens axis. The electromagnetic lens 50 includes a coil 52 and a magnetic material yoke 53. The coil 52 includes a winding wound around the lens axis. The magnetic material yoke 53 surrounds the coil 52, and has a shape axially symmetric with respect to the lens axis. The magnetic material yoke 53 includes a gap 54 at a side closer to the lens axis. The gap 54 is a gap structure which is provided in a portion of the magnetic material yoke 53 and is axially symmetric with respect to the lens axis.

When the current around the lens axis is fed to the coil 52, both ends of the magnetic material yoke 53 which are opposed to each other with the gap 54 being sandwiched therebetween are polarized into the north pole and the south pole, which leads to generation of a local magnetic field in the vicinity of the gap 54. The local magnetic field is distributed symmetric with respect to the lens axis. The direction of the magnetic field generated by the electromagnetic lens 50 is directed toward an extending direction of the lens axis, on the lens axis. The intensity of the magnetic field on the lens axis indicates a maximum value in the vicinity of the gap 54, and the intensity is abruptly lowered as being away from the gap 54 in the Z axis direction. The local magnetic field having such distribution acts a lens effect corresponding to a convex lens on the electron beam EB which passes along the lens axis.

Figure 11:
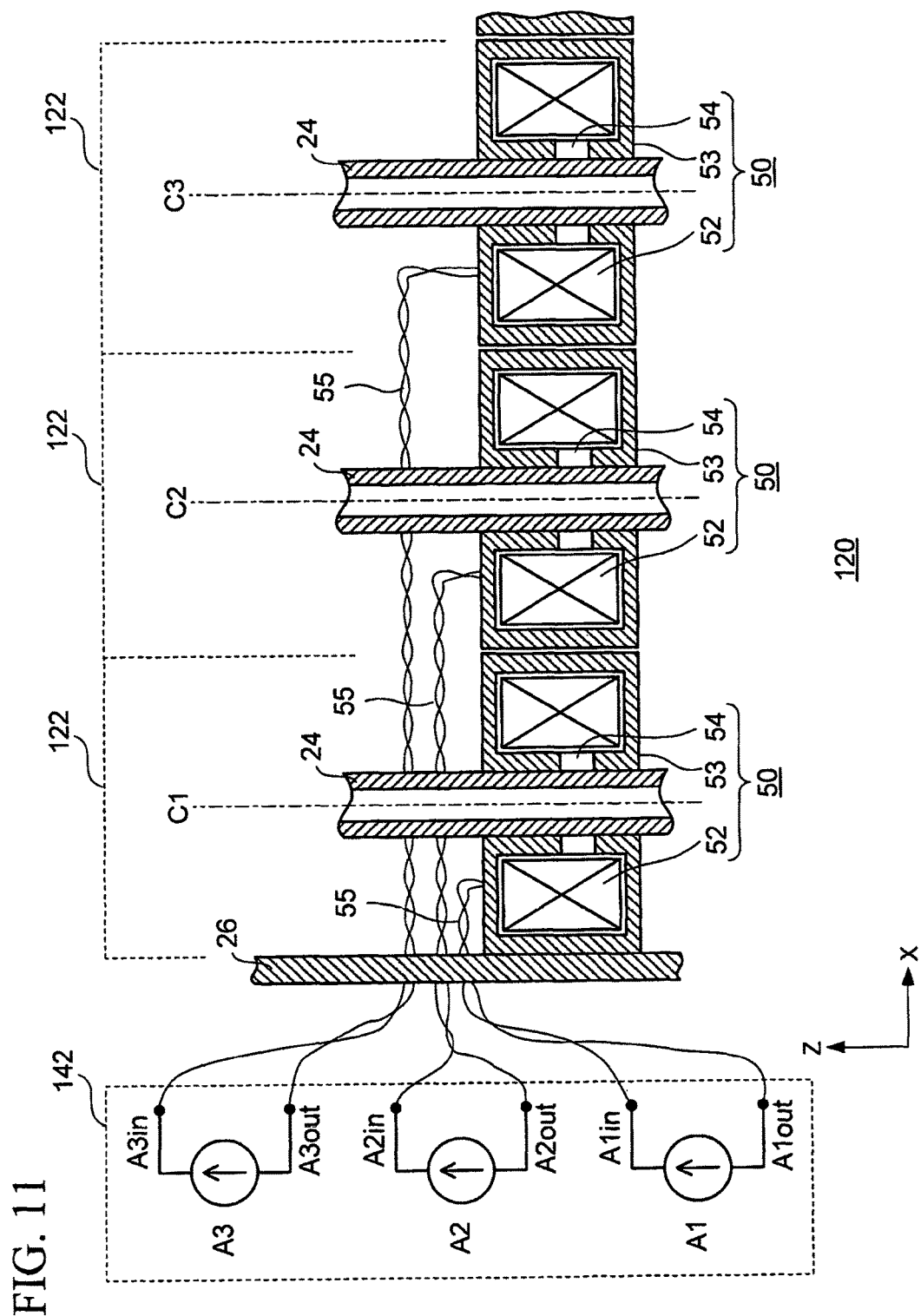
FIG. 11 is a cross-sectional view illustrating a conventional example of the electromagnetic lenses 50 provided in the multicolumn device 120.

Examples of the configuration of the coil 52 which excites the electromagnetic lens 50 and the connection of the coils 52 will be explained next. Before the example illustrated in FIG. 4 according to this embodiment is explained, a conventional configuration of the coil 52 and a conventional connection of the coils 52 in the multicolumn device are explained. FIG. 11 is a cross-sectional view illustrating a conventional example of the electromagnetic lenses 50 provided in the multicolumn device 120. The constituent members the operations of which are approximately the same as those of the electromagnetic lens 50 illustrated in FIG. 4 are assigned with the same reference numerals to simplify the explanation.

The three electromagnetic lenses 50 illustrated in FIG. 11 are respectively excited by the coils 52 which include continuous windings wound around the lens axis C1, C2, and C3. A cable 55 extends both ends of the winding of each coil 52 to the outside of the multicolumn device 120 through an outer wall section 26 of the multicolumn device 120. The cable 55 connects both ends of the winding of the coil 52 to the driving unit 142 which is installed in the outside of the multicolumn device 120. The driving unit 142 includes a plurality of current source circuits A1, A2, and A3, and outputs the current to the windings of the coils 52 based on the set values by the lens controller 148 (see FIG. 3).

The current source circuits A1, A2, and A3 included in the driving unit 142 are connected to the coils 52 of the electromagnetic lenses 50 which respectively include the lens axes C1, C2, and C3. A current outputted from a terminal A1in of the current source circuit A1 flows through the winding of the coil 52 of the electromagnetic lens 50 which includes the axis C1, and returns to a terminal A1out of the same circuit A1 without any change.

Similarly, currents outputted from terminals of the current source circuits A2 and A3 respectively flow through the windings of the coils 52 of the electromagnetic lenses 50 which include the axes C2 and C3, and return to the terminals of the current source circuits A2 and A3 without any change. In other words, in the conventional example illustrated in FIG. 11, the electromagnetic lenses 50 provided in the multicolumn device 120 correspond to the current source circuits provided in the driving unit 142 in a ratio of 1:1. The electromagnetic lenses 50 are respectively excited with the currents outputted by the different current source circuits.

Such a conventional example has problems below.

A first problem is that an influence due to the electromagnetic lenses 50 being respectively driven by the different current source circuits may possibly appear in an exposure result. The output characteristic of each of the current source circuits has an influence on the beam characteristic of the electron beam EB which is controlled by the electromagnetic lens 50 driven by the current source circuit. This causes such a problem, for example, that the line width accuracy and the position accuracy of an exposure pattern in a region 200 (see FIG. 2) exposed by the column cell 122 corresponding to a given current source circuit are different from the accuracies of an exposure pattern in a region 200 exposed by another column cell 122.

A second problem is the increased types of members which constitute the multicolumn device 120 if a connection member of the coil 52, for example, the cable 55, is included. The plurality of column cells 122 are disposed within the XY plane in parallel with the surface of the sample 10 at predetermined pitches. The electromagnetic lenses 50 which respectively belong to different column cells 122 have different distances to the driving unit 142 depending on the positions at which the respective column cells 122 are placed in the multicolumn device 120. A connection member which connects the electromagnetic lens 50 and the driving unit 142 to each other may possibly have a different size, shape, or the like for each column cell 122. This causes such a problem that the type of members which constitute the multicolumn device 120 is increased and the members are incompatible with one another.

A third problem is that the cables 55 which are connection members of the coils 52 may be collected in a large number in the vicinity of the outer wall section 26 of the multicolumn device 120 in some cases. The plurality of column cells 122 are disposed not only in the vicinity of the outer wall section 26 but in the center portion of the multicolumn device 120.

The cable 55 which is led to the column cell 122 disposed in the center portion is connected to the driving unit 142 through the outer wall section 26. This causes a large number of the cables 55 which connect the column cells 122 disposed both in the center portion and in the surrounding portion of the multicolumn device 120 to the driving unit to be gathered in the vicinity of the outer wall section 26 of the multicolumn device 120, thereby making it difficult to suitably dispose the connection members.

Taking into consideration the abovementioned problems of the conventional multicolumn device 120, a configuration example of the coil 52 according to this embodiment and an example of the connection of the coils 52 will be explained using FIG. 4.

FIG. 4 illustrates an example in which the coil 52 of the electromagnetic lens 50 includes windings 52a and 52b which are wound around the lens axis in the interior of the magnetic material yoke 53. The windings 52a and 52b are coils each having the number of turns obtained by dividing the total number of turns of the coil 52 in a predetermined ratio, which is indicated later. When the current is fed to the winding of the coil, the product of the current value and the number of turns, in other words, a magnetomotive force polarizes both ends of the magnetic material yoke 53 which are opposed to each other with the gap 54 being sandwiched therebetween, and a lens magnetic field to be generated in the vicinity of the gap 54.

The intensity of the lens magnetic field is decided based on the total sum of the magnetomotive forces of all the windings wound around the lens axis, but is independent of the arrangement of the windings in the interior of the magnetic material yoke 53. The example illustrated in FIG. 4 illustrates an example in which the windings 52a and 52b are disposed one above the other separately in the Z axis direction. In place of this, the windings 52a and 52b having the same number of turns and the same current value may be disposed in a vertically reverse manner from the arrangement example in FIG. 4 or may be disposed so as to be separated into sides close to and far from the lens axis.

The electromagnetic lens 50 includes a connection section 56. The connection section 56 connects the divided winding of the coil 52 to the divided winding of the coil 52 which belongs to another column cell 122. The connection section 56 connects the divided windings 52a and 52b of the Lens C1 which includes the lens axis C1 to the divided windings 52a and 52b of the Lens C2 which includes the lens axis C2. Moreover, the connection section 56 connects the divided windings 52a and 52b of the Lens C2 which includes the lens axis C2 to the divided windings 52a and 52b of the Lens C3 which includes the lens axis C3.

The column cell 122 to which the Lens C1 belongs and the column cell 122 to which the Lens C2 belongs are disposed adjacent to each other. The column cell 122 to which the Lens C2 belongs and the column cell 122 to which the Lens C3 belongs are disposed adjacent to each other. In other words, the connection section 56 connects the windings of the coils 52 which belong to the adjacent column cells 122.

In the example of FIG. 4, the three electromagnetic lenses 50 included in the three column cells 122 which constitute a column group are respectively driven by the three current source circuits A1, A2, and A3 included in the driving unit 142 which is installed outside the multicolumn device 120. The current source circuits A1, A2, and A3 are connected to the electromagnetic lens 50 which includes the divided windings 52a and 52b through the outer wall section 26 of the multicolumn device 120. Only the electromagnetic lens 50 at the closest position to the outer wall section 26 of the multicolumn device 120 may be directly connected to the current source circuits A1, A2, and A3.

This eliminates the necessity of cables which connect the windings 52a and 52b of the coil which belong to the column cell 122 disposed in the center portion of the multicolumn device 120 to the driving unit 142 to simplify the arrangement of the cables, which can prevent the cables in the vicinity of the outer wall section 26 from being collected.

Figure 5:
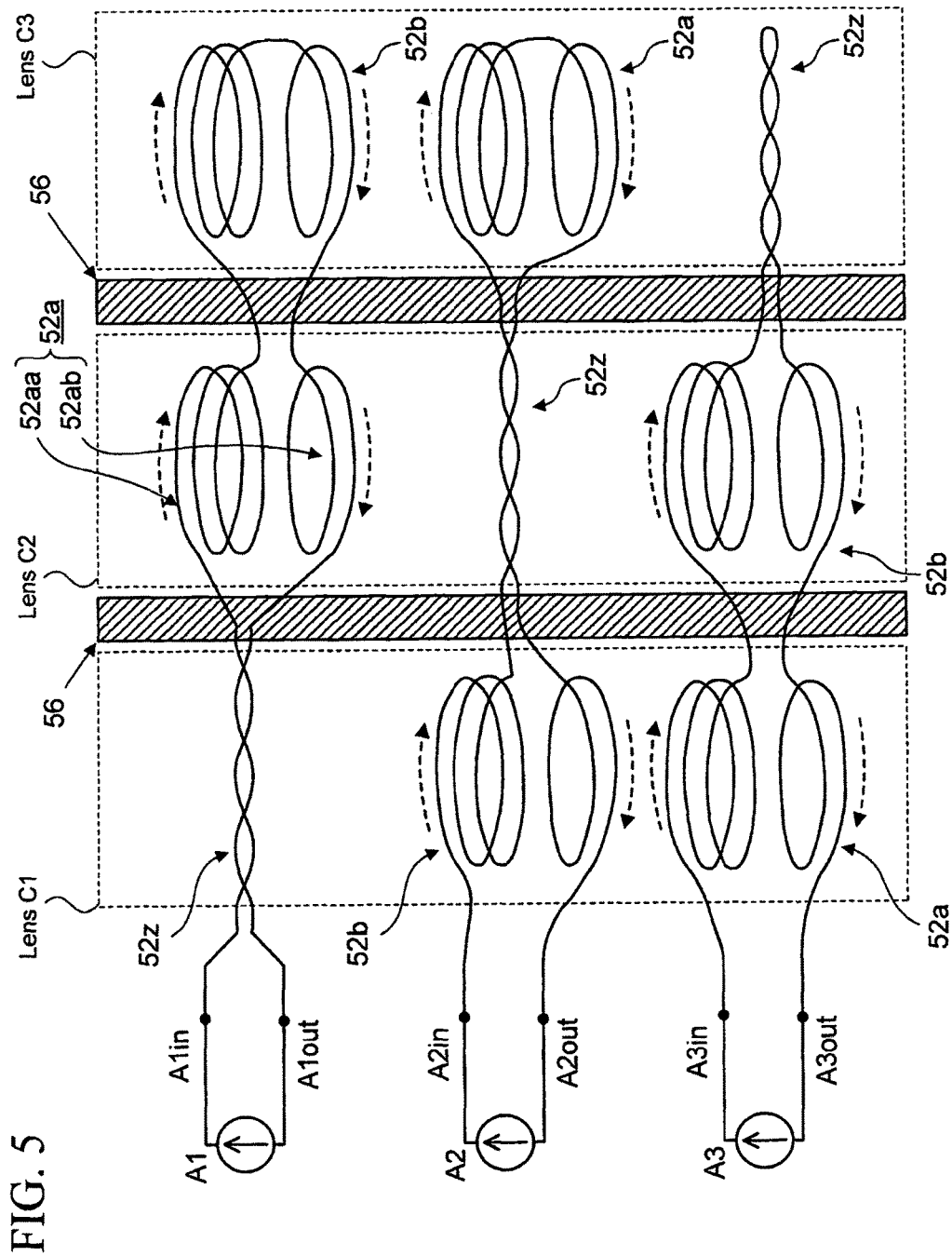
FIG. 5 illustrates examples of the configuration of windings in coils 52 and the connection between the windings in a column group including three column cells 122.

FIG. 5 illustrates examples of the configuration of windings in coils 52 and the connection between the windings in a column group including three column cells 122. The interiors of dashed-line frames respectively illustrated as the Lens C1, the Lens C2, and the Lens C3 indicate the configurations of the coils 52 which excite the Lens C1, the Lens C2, and the Lens C3. The coil 52 which excites the electromagnetic lens 50 is divided into a number less than the number of the column cells 122 which constitute the column group.

In a case of the column group in FIG. 5 which includes the three column cells 122, each of the coils 52 of the Lens C1, the Lens C2, and the Lens C3 is divided into the two windings 52a and 52b, for example. The windings 52a and 52b are windings respectively obtained by dividing a total number N of turns in the coil 52 in ratios $\alpha$ and $\beta$ (where $\alpha+\beta=1$) of the number of turns. The windings 52a and 52b are windings respectively having numbers $N\alpha$ and $N\beta$ of turns.

Each of the coils 52 of the Lens C1, the Lens C2, and the Lens C3 includes a winding 52z which does not excite the electromagnetic lens 50, in addition to the winding 52a and the winding 52b. The winding 52z is wiring which is not wound around the lens axis of the electromagnetic lens 50. The winding 52z is wiring which is created such that two cables through which currents having the same magnitude but in the opposite directions flow are twisted so as to induce no magnetic field in the surroundings, for example.

A path of an output current from the current source circuit A1 will be explained in detail. The connection section 56 successively connects portions of the windings of the coils 52 included in the three column cells 122 which constitute the column group to form a continuous current path. The continuous current path is provided with an input terminal A1in at one end and an output terminal A1out at the other end, and is connected to the current source circuit A1. The current that the current source circuit A1 outputs between the terminals A1in and About flows through the winding 52z which does not excite the electromagnetic lens 50, in the Lens C1. The connection section 56 between the Lens C1 and the Lens C2 connects one end portion of the winding 52z of the Lens C1 to an end portion of the winding 52a of the Lens C2.

The winding 52a is further separated into two portions 52aa and 52ab, in the Lens C2. The connection section 56 between the Lens C1 and the Lens C2 connects one end portion of the winding 52z of the Lens C1 to the portion 52aa of the Lens C2. The connection section 56 between the Lens C1 and the Lens C2 connects the other end portion of the winding 52z of the Lens C1 to the portion 52ab of the Lens C2. This causes all the current having flowed through the winding 52z of the Lens C1 in one direction to flow through the portion 52aa which is a portion of the windings of the Lens C2. Moreover, this causes all the current having flowed through the portion 52ab which is a portion of the windings of the Lens C2 to flow through the winding 52z of the Lens C1 in an opposite direction.

The output current from the current source circuit A1 flows through the two portions 52aa and 52ab of the winding 52a in directions indicated by dashed-line arrows in FIG. 5, in the Lens C2. When a right spiral proceeds in the −Z direction through which the electron beam EB passes, for example, the current flowing through each of the two portions 52*aa* and 52*ab* flows in a direction to rotate the right spiral, in other words, in a direction of the right spiral. The current flowing through each of the two portions 52*aa* and 52*ab* excites the Lens C2 in the same direction. The winding 52*a* having the number Nα of turns (where N is the total number of turns of the coil 52 in the Lens C2, and a is the ratio of the number of turns of the divided winding) is configured to combine the windings of the two portions 52*aa* and 52*ab* together.

The connection section 56 between the Lens C2 and the Lens C3 connects an end portion of the winding 52*a* of the Lens C2 to an end portion of the winding 52*b* of the Lens C3. The connection section 56 between the Lens C2 and the Lens C3 connects the portion 52*aa* of the Lens C2 to one end of the winding 52*b* of the Lens C3. The connection section 56 between the Lens C2 and the Lens C3 connects the portion 52*ab* of the Lens C2 to the other end of the winding 52*b* of the Lens C3. This causes all the current having flowed through the portion 52*aa* which is a portion of the windings of the Lens C2 to flow through the winding 52*b* of the Lens C3. Moreover, this causes all the current having flowed through the winding 52*b* of the Lens C3 to flow through the portion 52*ab* which is a portion of the windings of the Lens C2.

The output current from the current source circuit A1 flows through the winding 52*b* in directions indicated by dashed-line arrows in FIG. 5, in the Lens C3. The direction of the current flowing through the winding 52*b* of the Lens C3 with respect to the lens axis C3 is the same as the direction of the current flowing through the winding 52*a* of the Lens C2 with respect to the lens axis C2 (for example, the direction of the right spiral). In other words, the winding 52*b* of the Lens C3 excites the Lens C3 in the same direction as the winding 52*a* of the Lens C2 does. The output current from the current source circuit A1 flows through the path described above in the coils 52 to excite the Lens C1, the Lens C2, and the Lens C3.

The output current from the current source circuit A2 flows through a similar path. The connection section 56 successively connects portions of the windings to form a continuous current path. The continuous current path is provided with an input terminal A2in at one end and an output terminal A2out at the other end, and is driven by the current source circuit A2. In this case, the order of windings to be connected to the current source circuit A2 is different from the order of windings to be connected to the current source circuit A1.

The output current from the current source circuit A2 flows through the winding 52*b* in the first Lens C1, flows through the winding 52*z* which does not excite the electromagnetic lens 50 in the next Lens C2, and flows through the winding 52*a* in the last Lens C3. The output current from the current source circuit A2 flowing through the winding 52*b* of the Lens C1 and the winding 52*a* of the Lens C3 excites the Lens C1 and the Lens C3 in a direction the same as that in which the output current from the current source circuit A1 excites the Lens C2 and the Lens C3 (for example, the direction of the right spiral).

In addition, the output current from the current source circuit A3 flows through a similar path. The connection section 56 successively connects portions of the windings to form a continuous current path. The continuous current path is provided with an input terminal A3in at one end and an output terminal A3out at the other end, and is driven by the current source circuit A3. The output current from the current source circuit A3 flows through the winding 52*a* in the first Lens C1, flows through the winding 52*b* in the Lens C2, and flows through the winding 52*z* which does not excite the electromagnetic lens 50 in the last Lens C3. The output current from the current source circuit A3 excites the Lens C1 and the Lens C2 in a direction the same as that in which the output current from the current source circuit A1 excites the Lens C2 and the Lens C3 (for example, the direction of the right spiral).

The output currents from the current source circuits A1, A2, and A3 flow through portions of the windings of the coils 52 which belong to all the column cells 122 which constitute the column group. Moreover, between the two column cells 122 where the divided windings of the coils 52 are connected to each other with the connection section 56 being sandwiched therebetween, all the current having passed through a portion of the windings of the coil 52 which belongs to one of the column cells 122 flows through a corresponding portion of the windings of the coil 52 which belongs to the other column cell 122.

The output currents from the plurality of current source circuits contribute to the excitation of the electromagnetic lenses 50 in all the column cells 122 which constitute the column group. When the output currents from the plurality of current source circuits respectively have different output characteristics, the output characteristics do not have influences only on a specific column cell 122. The variation in output characteristics of the output currents from the current source circuits is dispersed into the plurality of column cells 122. This may possibly allow the configuration example of the coils 52 according to this embodiment to decrease an accuracy difference in exposure patterns, for example, in the irradiation allowable region 200 which is exposed by the different column cells 122. In other words, this may possibly contribute to solving the first problem in the conventional example.

Moreover, the connection section 56 mutually connects the windings of the same types between any column cells 122. When the current outputted from the current source circuit is connected from the Lens C1 to the Lens C2, the connection section 56 connects the current from the winding 52*z* which does not excite the lens to the winding 52*a* having the number Nα of turns, the current from the winding 52*b* having the number Nβ of turns to the winding 52*z* which does not excite the lens, and the current from the winding 52*a* having the number Nα of turns to the winding 52*b* having the number Nβ of turns. When the current is connected from the Lens C2 to the Lens C3, the connection section 56 connects the current from the winding 52*a* having the number Nα of turns to the winding 52*b* having the number Nβ of turns, the current from the winding 52*z* which does not excite the lens to the winding 52*a* having the number Nα of turns, and the current from the winding 52*b* having the number Nβ of turns to the winding 52*z* which does not excite the lens.

In other words, between the Lens C1 and the Lens C2 and between the Lens C2 and the Lens C3, the connection section 56 connects the windings of the same types to each other. A connection relation between an outlet-side connection section of the Lens C1 which is led from the windings 52*a*, 52*b*, and 52*z* belonging to the Lens C1 and an inlet-side connection section of the Lens C2 which directs toward the windings 52*a*, 52*b*, and 52*z* belonging to the Lens C2 is the same as a connection relation between an outlet-side connection section of the Lens C2 which is led from the windings 52*a*, 52*b*, and 52*z* belonging to the Lens C2 and an inlet-side connection section of the Lens C3 which directs toward the windings 52a, 52b, and 52z belonging to the Lens C3.

In other words, in the examples of the configuration and the connection of the coils 52 according to this embodiment, members which constitute the plurality of column cells 122 may be members of the same types including the windings 52a, 52b, and 52z and the connection relation by the connection section 56. This indicates that the plurality of column cells 122 which constitute the multicolumn device 120 have a compatibility among the members. This contributes to solving the second problem in the conventional example.

The examples of the configuration and the connection of the windings of the coils according to this embodiment reduce the characteristic variation in beams among the column cells 122 and enhance the commonality in members among the column cells 122. This contributes to a stable operation of the multicolumn device 120 which includes a large number of the column cells 122. Moreover, this also contributes to the production of the multicolumn device 120 with high efficiency.

A magnetomotive force F1, F2, or F3 which decides the lens intensity of the Lens C1, the Lens C2, or the Lens C3 is obtained such that a magnetomotive force generated when the output current from the current source circuit flows through the windings 52a and 52b is added for each lens. The magnetomotive forces F1, F2, and F3 are calculated with the following (Formula 1) from output currents I1, I2, and I3 from the current source circuits A1, A2, and A3, the total number N of turns of the coil, and the ratios $\alpha$ and $\beta$ of the number of turns.

$$F1 = (0 \cdot I1 + \beta \cdot I2 + \alpha \cdot I3) \times N$$

$$F2 = (\alpha \cdot I1 + 0 \cdot I2 + \beta \cdot I3) \times N$$

$$F3 = (\beta \cdot I1 + \alpha \cdot I2 + 0 \cdot I3) \times N \qquad \text{(Formula 1)}$$

where $\alpha + \beta = 1$

The output currents I1, I2, and I3 are normally set to I1=I2=I3=I. In this case, the magnetomotive forces F1, F2, and F3 satisfy F1=F2=F3=I·N=F (ampere-turn). The output currents from the current source circuits A1, A2, and A3 each have a random noise component $\delta I$ in addition to the steady current component I. A variational component $\delta F$ is discussed, which results from the noise component $\delta I$ of the output current and is generated in the magnetomotive force F of the Lens C1, the Lens C2, or the Lens C3. This variational component $\delta F$ is expressed by the following expression (Formula 2).

$$\delta F = \delta I \cdot N \cdot \sqrt{(\alpha^2 + \beta^2)} \qquad \text{(Formula 2)}$$

When a magnetomotive force caused by the windings 52a and 52b is added for each lens, the random noise component $\delta I$ is effectually compressed to $\sqrt{(\alpha^2+\beta^2)}$ to vary the magnetomotive force of the lens. This is because the windings 52a and 52b are connected to the current source circuits which are independent of and different from each other. When the ratio of the number of turns satisfies $\alpha=\beta=\frac{1}{2}$, the variational component $\delta F$ of the magnetomotive force due to the random noise component $\delta I$ has a magnitude compressed to $1/(\sqrt{2})$, compared with the variational component $\delta I \cdot N$ when each lens is driven by one current source circuit.

A case where noise is mixed in a specific current source circuit, for example, the output current I1 from the current source circuit A1 is considered. From the relational expression (Formula 1), the noise of the output current I1 appears in the variation in the magnetomotive force F2 of the Lens C2 and the variation in the magnetomotive force F3 of the Lens C3. When the ratio of the number of turns satisfies $\alpha=\beta=\frac{1}{2}$, the variation in the magnetomotive force generated in each of the Lens C2 and the Lens C3 has a magnitude compressed to $\frac{1}{2}$, compared with the variation in the magnetomotive force generated when each lens is driven by one current source circuit.

In any cases, with the example according to this embodiment, the multicolumn device 120 can compress the variation in the magnetomotive force F due to the random noise component and the variation in output characteristics in the current source circuits, and expose the irradiation allowable region 200 in the column cell 122. Such a compression effect on the noise component and the variational component is achieved because one column cell 122 includes the divided windings of the coil 52 and is driven by a plurality of independent current source circuits. In order that one column cell 122 is driven by two or more current source circuits, it is required that three or more column cells 122 constitute a column group and the winding of the coil 52 be divided into at least two windings.

A case where the lens intensity of the electromagnetic lens 50 is adjusted for each of the three column cells 122 which constitute the column group is considered. For example, a case where the optimal lens intensity of the electron beam EB passing through the Lens C1 is adjusted when the magnetomotive force F1 of the Lens C1 is changed by $\Delta F1$ and the magnetomotive force F2 of the Lens C2 and the magnetomotive force F3 of the Lens C3 are not changed, is considered. In this case, the output currents from the current source circuits A1, A2, and A3 are changed as follows.

$$\Delta I1 = \Delta F1 \times (-\alpha\beta)/N/(\alpha^3+\beta^3)$$

$$\Delta I2 = \Delta F1 \times (\beta^2)/N/(\alpha^3+\beta^3)$$

$$\Delta I3 = \Delta F1 \times (\alpha^2)/N/(\alpha^3+\beta^3) \qquad \text{(Formula 3)}$$

A case where the ratio of the number of turns is $\alpha=\beta=\frac{1}{2}$ is specifically indicated. The relational expression (Formula 3) corresponds to respectively changing the output currents from the current source circuits A1, A2, and A3 from initial values by $\Delta I1=-\Delta F1/N$, $\Delta I2=\Delta F1/N$, and $\Delta I3=\Delta F1/N$. As a result, such a condition that the magnetomotive force F1 of the Lens C1 is changed by $\Delta F1$ but the magnetomotive force F2 of the Lens C2 and the magnetomotive force F3 of the Lens C3 are not changed, can be set. All the output currents from the current source circuits A1, A2, and A3 are changed to allow only the magnetomotive force of the Lens C1 to be changed because changes in magnetomotive forces of the Lens C2 and the Lens C3 are canceled to each other.

Similarly, the output currents from the current source circuits can be set such that only the magnetomotive force F2 of the Lens C2 is changed but the magnetomotive force F1 of the Lens C1 and the magnetomotive force F3 of the Lens C3 are not changed. Moreover, the output currents from the current source circuits can be set such that only the magnetomotive force F3 of the Lens C3 is changed but the magnetomotive force F1 of the Lens C1 and the magnetomotive force F2 of the Lens C2 are not changed. For each of the three column cells 122 which constitute the column group, the lens intensity of the electromagnetic lenses 50 can be adjusted while changing each of magnetomotive forces F1, F2, and F3 which excite the electromagnetic lenses 50.

Note that, herein, the adjustment method of the lens intensity has been described in a case where the division ratios of the number of turns in the Lens C1, the Lens C2, and the Lens C3 are α and β in all the lenses. In the actual multicolumn device 120, depending on a processing state at the winding end portions, for example, the changes in magnetomotive forces of the Lens C2 and the Lens C3 are not canceled to each other in some cases with the output current values indicated in (Formula 3).

In this case, for example, a relation between the output current I1 and the output current I3 in which the lens intensity of the Lens C2 is not changed, a relation between the output current I1 and the output current I2 in which the lens intensity of the Lens C3 is not changed, and other relations are measured in advance. Form the measured relations between the output currents, a relation between the magnetomotive forces that the respective windings have to effectually generate in order to cancel the changes in the lens intensity is obtained. From this effectual relation between the magnetomotive forces, for example, it is possible to set the output currents which cause the changes in the lens intensity of the Lens C2 and the Lens C3 to be canceled from each other and only the magnetomotive force of the Lens C1 to be changed.

Figure 6:
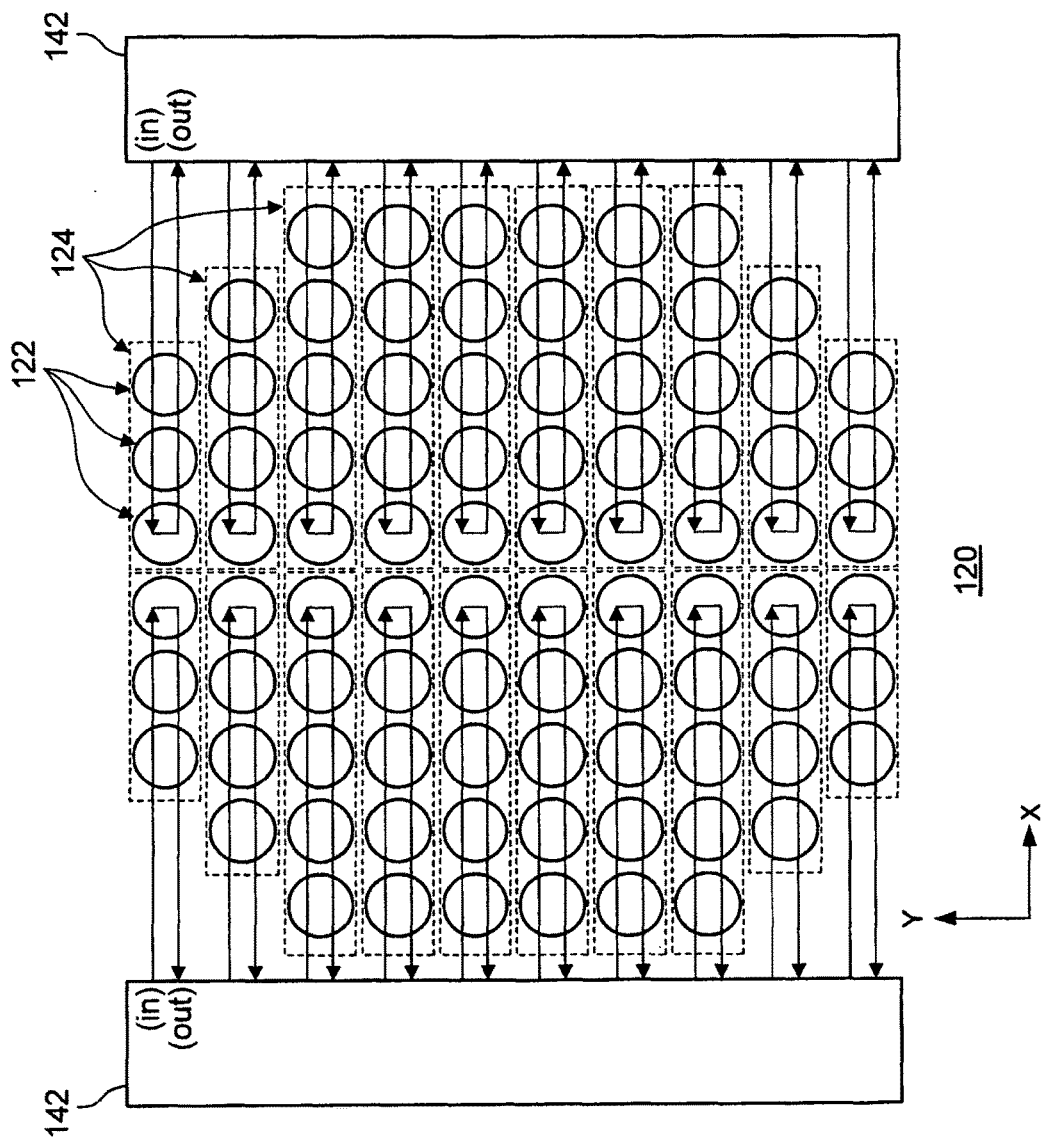
FIG. 6 illustrates a first configuration example of column groups 124, with respect to 88 column cells 122 which constitute the multicolumn device 120 according to this embodiment.

FIG. 6 illustrates a first configuration example of column groups 124, with respect to the 88 column cells 122 which constitute the multicolumn device 120 according to this embodiment. FIG. 6 illustrates an arrangement example of the 88 column cells 122 within the XY plane in parallel with the surface of the sample 10. A plurality of column cells 122 which are surrounded by a dashed-line frame and arranged in the X direction constitute the column group 124. The column groups each including the column cells 122 disposed at the left side from the center line in the X direction and the column groups each including the column cells 122 disposed at the right side from the center line in the X direction, are present.

The types of the column groups 124 include the column group 124 with three column cells 122, the column group 124 with four column cells 122, and the column group 124 with five column cells 122. Each of the column cells 122 is provided with an electromagnetic lens, which is an example of the electromagnetic element which controls the electron beam EB. The electromagnetic lens is excited by the coil including divided windings. The windings in the coils of the column cells 122 which are included in the column group 124 and adjacent to each other are connected to each other with the connection section (not illustrated).

The windings included in the coils are successively connected using the connection sections to form a continuous current path. In FIG. 6, an arrow joining the column cells 122 which constitute each column group 124 schematically illustrates a current path for each column group 124. The total number of formed current paths is equal to the number of the column cells 122 which constitute the multicolumn device 120, for example, 88. Each of the current paths is connected, at an end portion thereof, to the current source circuit which feeds the current to the winding in the coil. Accordingly, the total number of current source circuits is 88, for example.

The driving units 142 each provided with the current source circuits the number of which is equal to the number of column cells which constitute the multicolumn device 120 are installed outside the region in the XY plane where the column cells 122 which constitute the multicolumn device 120 are disposed. In the example illustrated in FIG. 6, the driving units 142 installed on the outside, in the X direction, of the region in the XY plane where the multicolumn device 120 is present. The driving unit 142 installed outside on the left is provided with 44 current source circuits, for example, and feeds the current between an input terminal (in) and an output terminal (out) of a current path formed in each of the column groups which are disposed on the left side form the center line in the X direction.

The driving unit 142 installed outside on the right is provided with 44 current source circuits, for example, and feeds the current between an input terminal (in) and an output terminal (out) of a current path formed in each of the column groups which are disposed at the right side form the center line in the X direction. The driving units 142 installed outside on the right and left can be installed at positions where the driving units 142 do not interference with the plurality of column cells 122 which constitute the multicolumn device 120.

The embodiment similar to the already explained examples of the configuration and the connection of the coils which belong to the column group including the three column cells 122 is applicable to a case where the column group includes three or more column cells 122. The similar embodiment is applicable to the column group including four or five column cells 122 illustrated in FIG. 6. Herein, a column group including five column cells 122 will be further explained.

Figure 7:
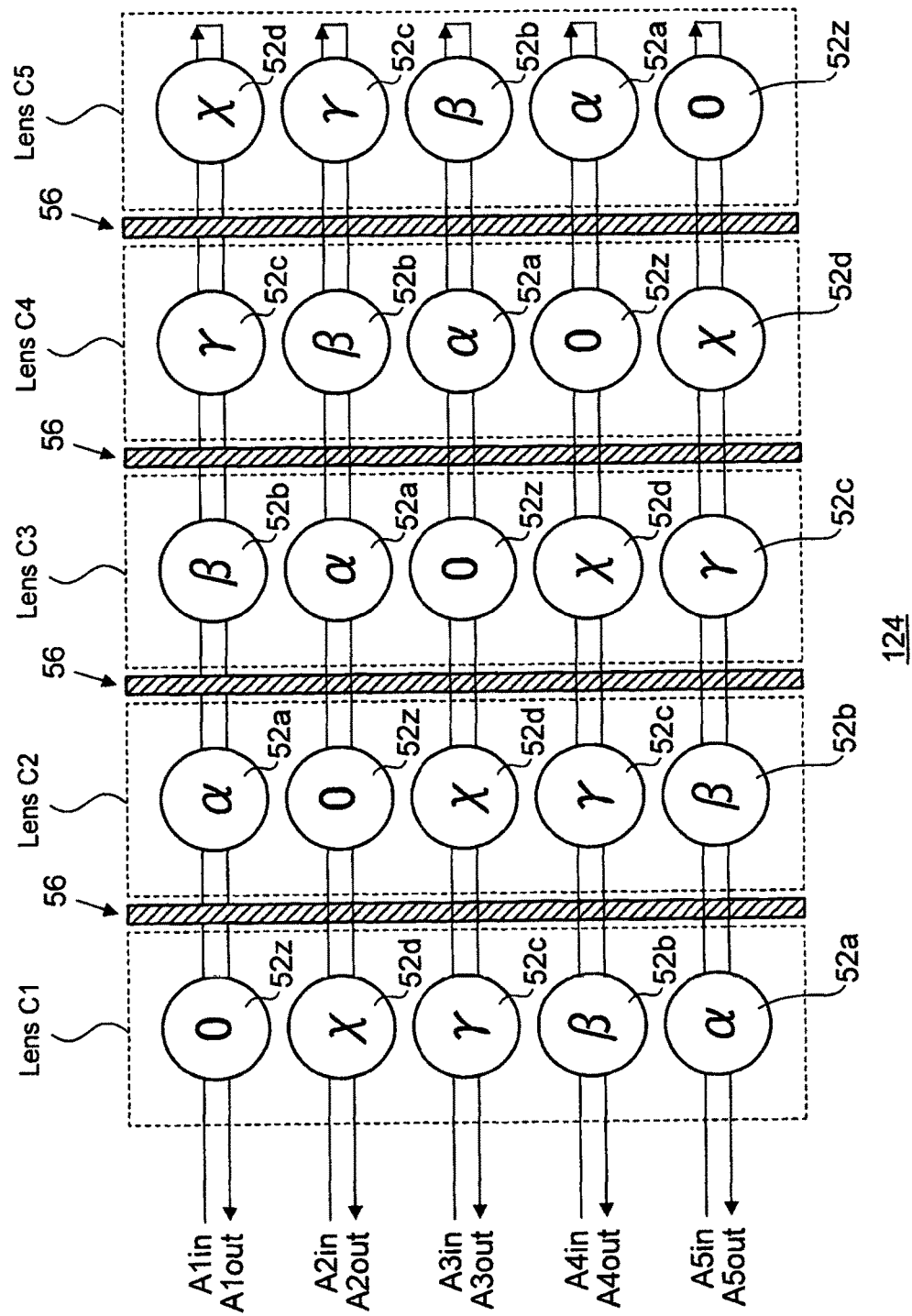
FIG. 7 illustrates examples of the configuration of windings in the coils and the connection between the windings in the column group 124 including five column cells 122.

FIG. 7 illustrates examples of the configuration of windings in the coils and the connection between the windings in the column group 124 including five column cells 122. Each of the five column cells 122 includes the Lens C1, the Lens C2, the Lens C3, a C4 lens, and a C5 lens each of which is the electromagnetic lens 50 and is an example of the electromagnetic element which controls the electron beam EB.

The interiors of dashed-line frames respectively described as the Lens C1, the Lens C2, the Lens C3, the C4 lens, and the C5 lens indicate the configurations of the coils 52 which excite the electromagnetic lenses 50. The coil 52 may be divided into a number less than the number of the column cells 122 which constitute the column group. In a case of the column group including the five column cells 122, the coil 52 is divided into four windings 52a, 52b, 52c, and 52d, for example. The windings 52a, 52b, 52c, and 52d, are windings respectively having the numbers Nα, Nβ, Nγ, and N$_\chi$ of turns (where α+β+γ+χ=1) which are obtained by dividing the total number N of turns in the coil 52 into four numbers in the ratios α, β, γ, and χ of the number of turns. FIG. 7 illustrates the windings as circles and the ratios α, β, γ, and χ of the number of turns as signs within the circles.

Each of the Lens C1, the Lens C2, the Lens C3, the C4 lens, and the C5 lens includes the winding 52z which does not excite the electromagnetic lens 50, in addition to the windings 52a, 52b, 52c, and 52d. The connection section 56 connects the divided windings to each other between the adjacent column cells 122, for example, between the Lens C1 and the Lens C2, between the Lens C2 and the Lens C3, between the Lens C3 and the C4 lens, and between the C4 lens and the C5 lens.

Each of the Lens C1, the Lens C2, the Lens C3, the C4 lens, and the C5 lens includes the windings 52a, 52b, 52c, and 52d, and the winding 52z which does not excite the electromagnetic lens. Accordingly, the connection section 56 forms five continuous current paths. The continuous current path includes an input unit A1in at one end and an output unit About at the other end, and is connected to the current source circuit A1. Five independent current source circuits respectively supply the current to the five continuous current paths. The current source circuits A1, A2, A3, A4, and A5 (not illustrated) respectively feed the current between the input unit A1in and the output unit About, between an input unit A2in and an output unit A2out, between an input unit A3in and an output unit A3out, between an input unit A4in and an output unit A4out, and between an input unit A5in and an output unit A5out.

The number of continuous current paths formed in the column group 124 and the number of current source circuits are equal to the number of the column cells 122 which constitute the column group 124. Between the two column cells 122 which are adjacent to each other with the connection section 56 being sandwiched therebetween, all the current having passed through a portion of the windings of the coil 52 which belongs to one of the column cells 122 flows through a corresponding portion of the windings of the coil 52 which belongs to the other column cell 122.

Magnetomotive forces F1, F2, F3, F4, and F5 which respectively decide the lens intensity of the Lens C1, the Lens C2, the Lens C3, the C4 lens, and the C5 lens are calculated with the following relational expression (Formula 4) from the output currents I1, I2, I3, I4, and I5 from the five independent current source circuits A1, A2, A3, A4, and A5, the total number N of turns of the coil of each lens, and the ratios $\alpha$, $\beta$, $\gamma$, and $\chi$ of the number of turns.

$$F1 = (0 \cdot I1 + \chi \cdot I2 + \gamma \cdot I3 + \beta \cdot I4 + \alpha \cdot I5) \times N$$

$$F2 = (\alpha \cdot I1 + 0 \cdot I2 + \chi \cdot I3 + \gamma \cdot I4 + \beta \cdot I5) \times N$$

$$F3 = (\beta \cdot I1 + \alpha \cdot I2 + 0 \cdot I3 + \chi \cdot I4 + \gamma I5) \times N$$

$$F4 = (\gamma \cdot I1 + \beta \cdot I2 + \alpha \cdot I3 + 0 \cdot I4 + \chi \cdot I5) \times N$$

$$F5 = (\chi \cdot I1 + \gamma \cdot I2 + \beta \cdot I3 + \alpha \cdot I4 + 0 \cdot I5) \times N \quad \text{(Formula 4)}$$

where $\alpha + \beta + \gamma + \chi = 1$

The output currents I1, I2, I3, I4, and I5 are normally set such that I1=I2=I3=I4=I5=I. In this case, the magnetomotive forces F1, F2, F3, F4, and F5 of the electromagnetic lenses satisfy F1=F2=F3=F4=F5=I·N=F (ampere-turn). The five current source circuits are circuits which are independent of each other, and thus the variation in the magnetomotive force F due to the random noise component is effectually compressed to the magnitude $\sqrt{(\alpha^2+\beta^2+\gamma^2+\chi^2)}$, compared with the variation in the magnetomotive force when each lens is driven by one current source circuit. In other words, when the ratio of the number of turns is $\alpha=\beta=\gamma=\chi=1/4$, the variation in the magnetomotive force generated in each of the Lens C1, the Lens C2, the Lens C3, the C4 lens, and the C5 lens has a magnitude compressed to ½, compared with the variation in the magnetomotive force when each lens is driven by one current source circuit.

Moreover, when a specific current source circuit, for example, the output current I1 from the current source circuit A1 has a variational component, the variation in the magnetomotive force F generated in each of the Lens C2, the Lens C3, the C4 lens, and the C5 lens has a magnitude compressed to ¼, compared with the variation in the magnetomotive force when each lens is driven by one current source circuit. The increased number of the column cells 122 which constitutes a column group allows one column cell 122 to be driven by more independent current source circuits in a distributed manner. This can compress and decrease the random noise component and the variation in output characteristics in the current source circuits.

In addition, when the lens intensity of the Lens C1 is to be adjusted, for example, and the ratio of the number of turns is $\alpha=\beta=\gamma=\chi=\frac{1}{4}$, the output currents from the current source circuits A1, A2, A3, A4, and A5 are respectively changed from initial values by I1=−3·ΔF1/N, I2=−ΔF1/N, I3=ΔF1/N, I4=ΔF1/N, and I5=ΔF1/N. From these changes and the relational expression (Formula 4), it is possible to adjust the optimal lens intensity of the electron beam EB passing through the Lens C1 by changing the magnetomotive force F1 of the Lens C1 by ΔF1 but not changing the magnetomotive forces of the other electromagnetic lenses 50.

Also in the example of FIG. 7, the connection section 56 mutually connects the windings of the same types between any column cells 122. When the current outputted from the current source circuit is connected from the Lens C1 to the Lens C2, the connection section 56 connects the current from the winding 52z to the winding 52a, from the winding 52d to the winding 52z, from the winding 52c to the winding 52d, from the winding 52b to the winding 52c, and from the winding 52a to the winding 52b. When the current is connected from the Lens C2 to the Lens C3, the connection section 56 connects the current from the winding 52a to the winding 52b, from the winding 52z to the winding 52a, from the winding 52d to the winding 52z, from the winding 52c to the winding 52d, and, from the winding 52b to the winding 52c.

When the current is connected from the Lens C3 to the C4 lens, the connection section 56 connects the current from the winding 52b to the winding 52c, from the winding 52a to the winding 52b, from the winding 52z to the winding 52a, from the winding 52d to the winding 52z, and from the winding 52c to the winding 52d. When the current is connected from the C4 lens to the C5 lens, the connection section 56 connects the current from the winding 52c to the winding 52d, from the winding 52b to the winding 52c, from the winding 52a to the winding 52b, from the winding 52z to the winding 52a, and from the winding 52d to the winding 52z.

Each of the five electromagnetic lenses 50 included in the column group 124 includes the windings 52a, 52b, 52c, 52d, and 52z of the same types. Moreover, the connection section 56 connects the windings of the same types to each other, between any electromagnetic lenses 50 included in the column group 124. In the examples of the configuration and the connection of the coils 52 illustrated in FIG. 7, members which constitute the plurality of column cells 122 may be members of the same types including the divided windings 52a, 52b, 52c, 52d, and 52z in the coils and the connection sections 56. The members which constitute the column cell 122 have a compatibility among the plurality of column cells 122.

The same applies to a case where a column group includes four column cells 122. The coil 52 which excites the electromagnetic lens 50 includes three divided windings, for example, and a winding which does not excite the electromagnetic lens 50. The connection section 56 connects the windings of the same types to each other between any column cells 122. The members which constitute the plurality of column cells 122 constituting a column group have a compatibility among column cells 122.

Figure 8:
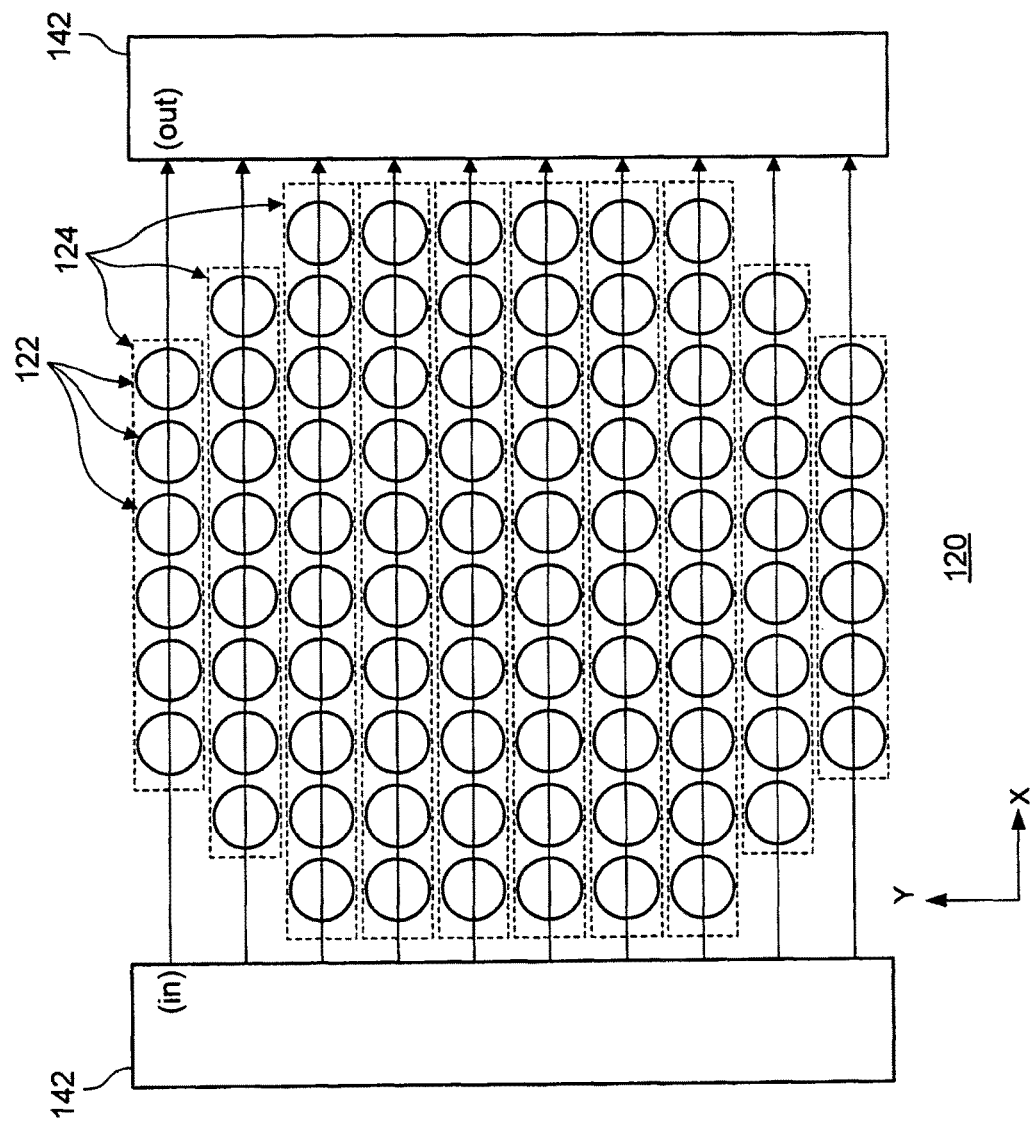
FIG. 8 illustrates a second configuration example of column groups 124, with respect to the 88 column cells 122 which constitute the multicolumn device 120 according to this embodiment.

FIG. 8 illustrates a second configuration example of column groups 124, with respect to the 88 column cells 122 which constitute the multicolumn device 120 according to this embodiment. In FIG. 8, a plurality of column cells 122 which are surrounded by a dashed-line frame and arranged in the X direction constitute the column group 124. The types of the column groups 124 include the column group 124 including six column cells 122, the column group 124 including eight column cells 122, and the column group 124 including ten column cells 122. Each column cell 122 includes a coil which includes divided windings.

Portions of the windings of the coils which belong to the adjacent column cells 122 are successively connected by a connection section (not illustrated) to form a continuous current path. An arrow joining the column cells 122 which constitute each column group 124 schematically illustrates a current path for each column group 124. In an example of the embodiment illustrated in FIG. 8, the current path is configured such that the current flows through only different column cells 122, and reaches an (out) terminal from an (in) terminal of a current source circuit included in the driving unit 142.

The (in) terminal and the (out) terminal of the current source circuit included in the driving units 142 are present separately in the driving units 142 at both left and right sides. The current outputted from the (in) terminal in the left-side driving unit 142 flows through the windings of the coils 52 in the six, eight, or ten column cells 122 which are arranged in the X direction, to the (out) terminal in the right-side driving unit 142. Although the current path of FIG. 8 is not a path which goes and returns in the same column cell 122, the configuration of the winding and the connection between the windings similar to those in the already explained embodiment are applicable thereto.

Figure 9:
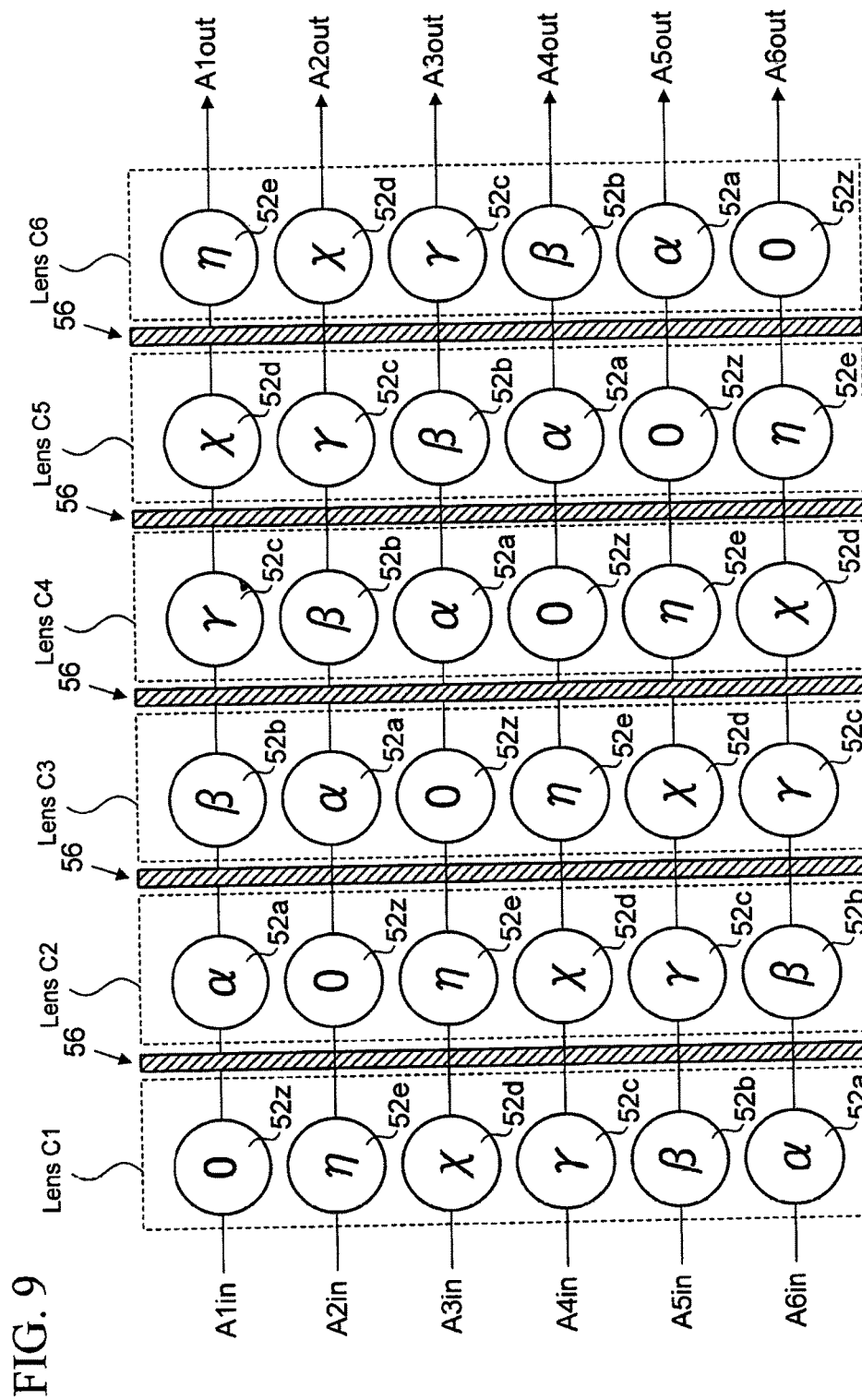
FIG. 9 illustrates examples of the configuration of windings in the coils and the connection between the windings in the column group 124 including six column cells 122.

FIG. 9 illustrates examples of the configuration of windings in the coils and the connection between the windings included in six column cells 122, in the example of the column groups 124 illustrated in FIG. 8. Each of the six column cells 122 include the Lens C1, the Lens C2, the Lens C3, the C4 lens, the C5 lens, and a C6 lens each of which is the electromagnetic lens 50 and is an example of the electromagnetic element which controls the electron beam EB.

The interiors of dashed-line frames respectively indicated as the Lens C1, the Lens C2, the Lens C3, the C4 lens, the C5 lens, and the C6 lens illustrate the configurations of the coils 52 which excite the electromagnetic lenses 50. The coil 52 is divided into a number less than the number of the column cells 122 which constitute the column group. In a case of the column group including the six column cells 122, the coil 52 is divided into five windings 52$a$, 52$b$, 52$c$, 52$d$, and 52$e$, for example. Moreover, the coil 52 includes the winding 52$z$ which does not excite the electromagnetic lens 50. Also in FIG. 9, the windings are indicated as circles and the ratios $\alpha$, $\beta$, $\gamma$, $\chi$, and $\eta$ of the number of turns are indicated as signs within the circles.

In a case of FIG. 9 in which no reciprocating current path is included, the winding 52$z$ which does not excite the electromagnetic lens is wiring which detours around the magnetic material yoke 53 which constitutes the electromagnetic lens 50, for example, and induces no magnetic field in the gap 54 of the magnetic material yoke 53. The connection section 56 connects the windings of the same types to each other between the adjacent column cells 122, between the Lens C1 and the Lens C2, between the Lens C2 and the Lens C3, between the Lens C3 and the C4 lens, between the C4 lens and the C5 lens, and between the C5 lens and the C6 lens to form six continuous current paths.

Left-side end portions of the six continuous current paths are connected to (in) terminals of current source circuits included in the driving unit 142 outside on the left. Right-side end portions of the six continuous current paths are connected to (out) terminals of current source circuits included in the driving unit 142 outside on the right. In other words, the driving units 142 installed outside on the right and left are installed at positions in the XY plane where the driving units 142 do not interfere with the plurality of column cells 122 which constitute the multicolumn device 120.

Also in this case, a relation between the magnetomotive force which decides the lens intensity and the output current from the current source circuit is expressed with a relational expression similar to (Formula 1) or (Formula 4). One electromagnetic lens 50 is driven by the six mutually independent current source circuits. The plurality of current source circuits can excite the lens magnetic fields in a state where the random noise component and the variation in output characteristics are compressed. All the column cells 122 which constitute the column group, including the connection section 56, may be configured by the same members.

The same applies to a case where the column group 124 includes eight or ten column cells. The coil 52 which excites the electromagnetic lens 50 includes windings which are divided into seven or nine, for example, and a winding which does not excite the electromagnetic lens 50. The connection section 56 connects the divided windings of the same types to each other between any column cells 122.

The winding of the coil 52 may preferably be divided into a large division number, and each of the divided windings may preferably have the suitable number of turns. To this end, the division number of the coil 52 may preferably be 9 or less, for example. In other words, the number of the column cells 122 which constitute the column group 124 may preferably be 10 or less.

Figure 10:
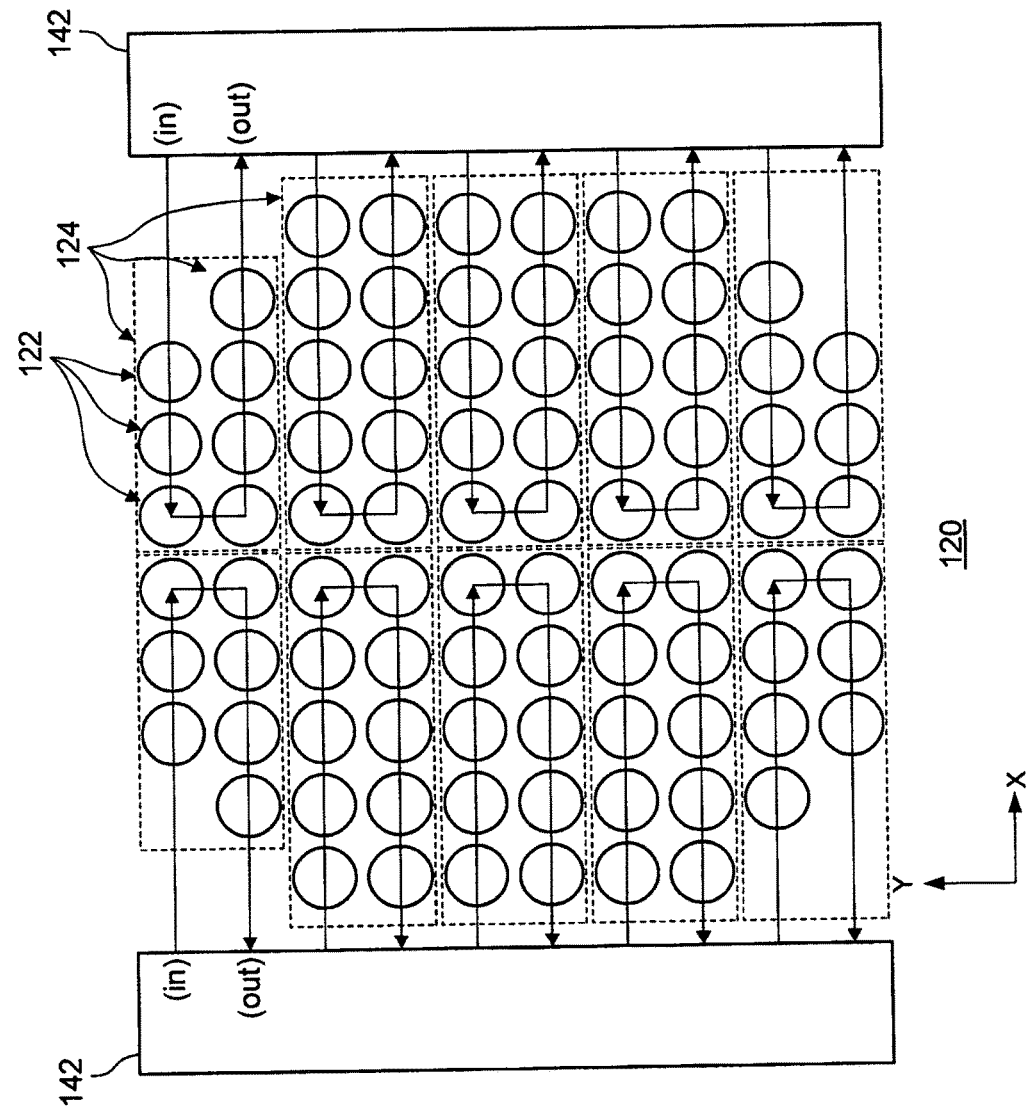
FIG. 10 illustrates a third configuration example of column groups 124, with respect to the 88 column cells 122 which constitute the multicolumn device 120 according to this embodiment.

FIG. 10 illustrates a third configuration example of column groups 124, with respect to the 88 column cells 122 which constitute the multicolumn device 120 according to this embodiment. A plurality of column cells 122 which are surrounded by a dashed-line frame constitute the column group 124. The types of the column groups 124 include the column group 124 including seven column cells 122 and the column group 124 including ten column cells 122. Each column cell 122 includes a coil which includes six-way or nine-way divided windings, for example, and a wiring which does not excite a magnetic field in the gap of the magnetic material. Portions of the windings of the coils in the adjacent column cells 122 are successively connected by a connection section to form a continuous current path.

An arrow joining the column cells 122 which constitute each column group 124 schematically illustrates a current path for each column group 124. In the example in FIG. 10, the current path is configured such that the current flows through only different column cells 122, and reaches an (out) terminal from an (in) terminal of a current source circuit included in the driving unit 142. The configuration and the connection of the divided windings of the coils are similar to those in the example of the already explained embodiment.

The driving unit 142 installed outside on the left is provided with 44 current source circuits, for example, and drives the electromagnetic lenses 50 which belong to the column cells 122 at the left side from the center line in the X direction. The driving unit 142 installed outside on the right is provided with 44 current source circuits, for example, and drives the electromagnetic lenses 50 which belong to the column cells 122 at the right side from the center line in the X direction. The driving units 142 can be installed at positions in the XY plane where the driving units 142 do not interfere with the plurality of column cells 122 which constitute the multicolumn device 120.

As described above, the examples of configuration and the connection of the windings of the coils in the multicolumn device 120 using the coils that excite the electromagnetic lenses as an example are explained in this embodiment. The examples of configuration and the connection of the windings of the coils according to this embodiment are applicable to all electromagnetic elements which are excited by the coil. The examples of configuration and the connection of the windings of the coils according to this embodiment are applicable to an electromagnetic deflector and a coil which excites the electromagnetic corrector.

Second Embodiment

An electromagnetic corrector, which is an example of an electromagnetic element will be explained in this embodiment.

Figure 12B:
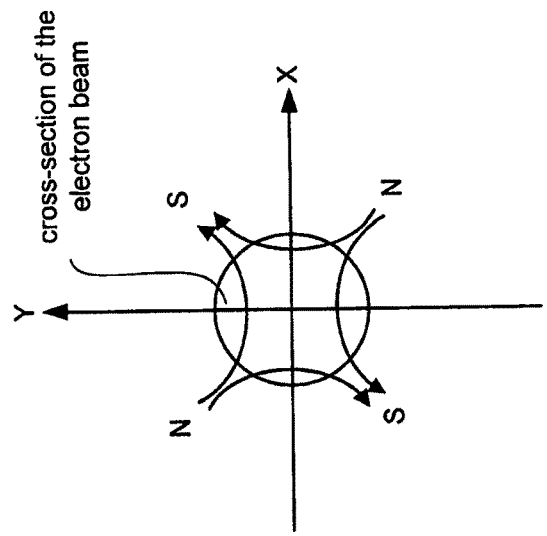
FIG. 12B is a plan view illustrating directions of a magnetic field of the electromagnetic corrector 40 excited by a coil 42.
Figure 12A:
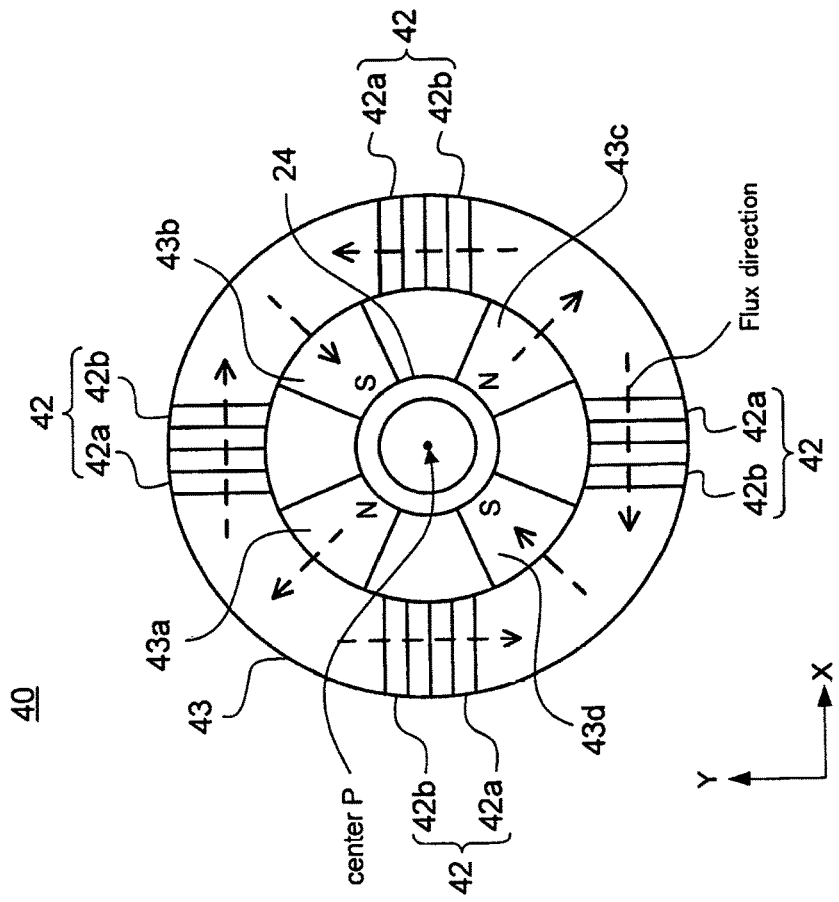
FIG. 12A is a view illustrating a configuration example of an electromagnetic corrector 40.

FIG. 12A is a plan view illustrating a configuration example of the electromagnetic corrector 40 (see FIG. 3) according to this embodiment.

The electromagnetic corrector 40 illustrated in FIG. 12A is installed in each of the column cells 122, and corrects the aberration of the electron beam EB passing through the column cell 122.

The electromagnetic corrector 40 includes a magnetic material ring 43 disposed within the XY plane perpendicular to the Z direction which is the traveling direction of the electron beam EB. The electron beam EB passes through a center P of the magnetic material ring 43, and passes through the electromagnetic corrector 40 in the direction perpendicular to the sheet on which the figure is drawn.

The magnetic material ring 43 is provided with at least four overhang parts 43a, 43b, 43c, and 43d toward the center P of the ring. The overhang parts 43a, 43b, 43c, and 43d respectively direct in (X+Y), (X−Y), −(X+Y), and −(X−Y) directions within the XY plane in the drawing.

Moreover, coils 42 for exciting the electromagnetic corrector 40 are respectively wound around four parts other than the overhang parts of the magnetic material ring 43. FIG. 12A illustrates an example in which the coils 42 of the electromagnetic corrector 40, each divided into two windings 42a and 42b, are wound around the four respective parts of the magnetic material ring 43. Similar to the case of the electromagnetic lens, the windings 42a and 42b are coils each having the number of turns obtained by dividing the total number of turns of each part in a predetermined ratio.

The magnetic material ring 43, the overhang parts 43a, 43b, 43c, and 43d, and the coils 42 for excitation are installed in the atmosphere. The vacuum partition wall 24 is a tubular partition wall which extends in the Z axis direction, and isolates a space in vacuum through which the electron beam EB passes from a space in the atmosphere.

The electromagnetic corrector 40 illustrated in the drawing is driven by an independent exciting current. Two-series exciting currents respectively flow through the windings 42a and 42b at the upper side (+Y side) in the drawing in the same direction with respect to the magnetic material ring 43. The exciting currents having flowed through the windings 42a and 42b at the upper side (+Y side) are connected using the inside wiring (not illustrated) so as to flow into the windings 42a and 42b at the left side (−X side) in the drawing.

The two-series exciting currents having flowed through the windings 42a and 42b at the left side (−X side) in the drawing are connected using the inside wiring (not illustrated) so as to flow into the windings 42a and 42b at the lower side (−Y side) in the drawing.

Hereinafter, similarly, the two-series exciting currents flow through the windings 42a and 42b at the right side (+X side) in the drawing, and flow out from the electromagnetic corrector 40.

These two-series exciting currents generate magnetic fluxes in the magnetic material ring 43 and the overhang parts 43a, 43b, 43c, and 43d in FIG. 12A, for example, in directions of dashed-line arrows in FIG. 12A.

This generates magnetic north poles and south poles illustrated in FIG. 12A, for example, at end portions of the overhang parts of the magnetic material in the electromagnetic corrector 40.

Arrows in FIG. 12B indicate directions of a magnetic field generated in an electron beam passing part in the vicinity of the center P of the magnetic material ring 43 due to the magnetic poles generated in the overhang parts of the magnetic material. This magnetic field acts a force in the −X direction on an electron passing through a portion at the +X side in FIG. 12B and acts a force in the +X direction on an electron passing through a portion at the −X side in FIG. 12B, for example.

Moreover, this magnetic field acts a force in the +Y direction on an electron passing through a portion at the +Y side in FIG. 12B and acts a force in the −Y direction on an electron passing through a portion at the −Y side in FIG. 12B. In this manner, the electromagnetic corrector 40 changes an opening angle with respect to the passage direction of the electron beam EB which passes therethrough to correct the aberration of the electron beam EB so as to generate a difference in the converge positions of the electron beams EB on the Z axis between in the X direction and in Y direction in the drawing. This allows the electromagnetic corrector 40 to correct a portion of the aberration of the electron beams.

The intensity of the correction magnetic field generated by the electromagnetic corrector 40 is decided based on the total sum of the magnetomotive forces generated by the two-series exciting currents flowing through the windings 42a and 42b which are wound around the four parts of the magnetic material ring 43.

Figure 13:
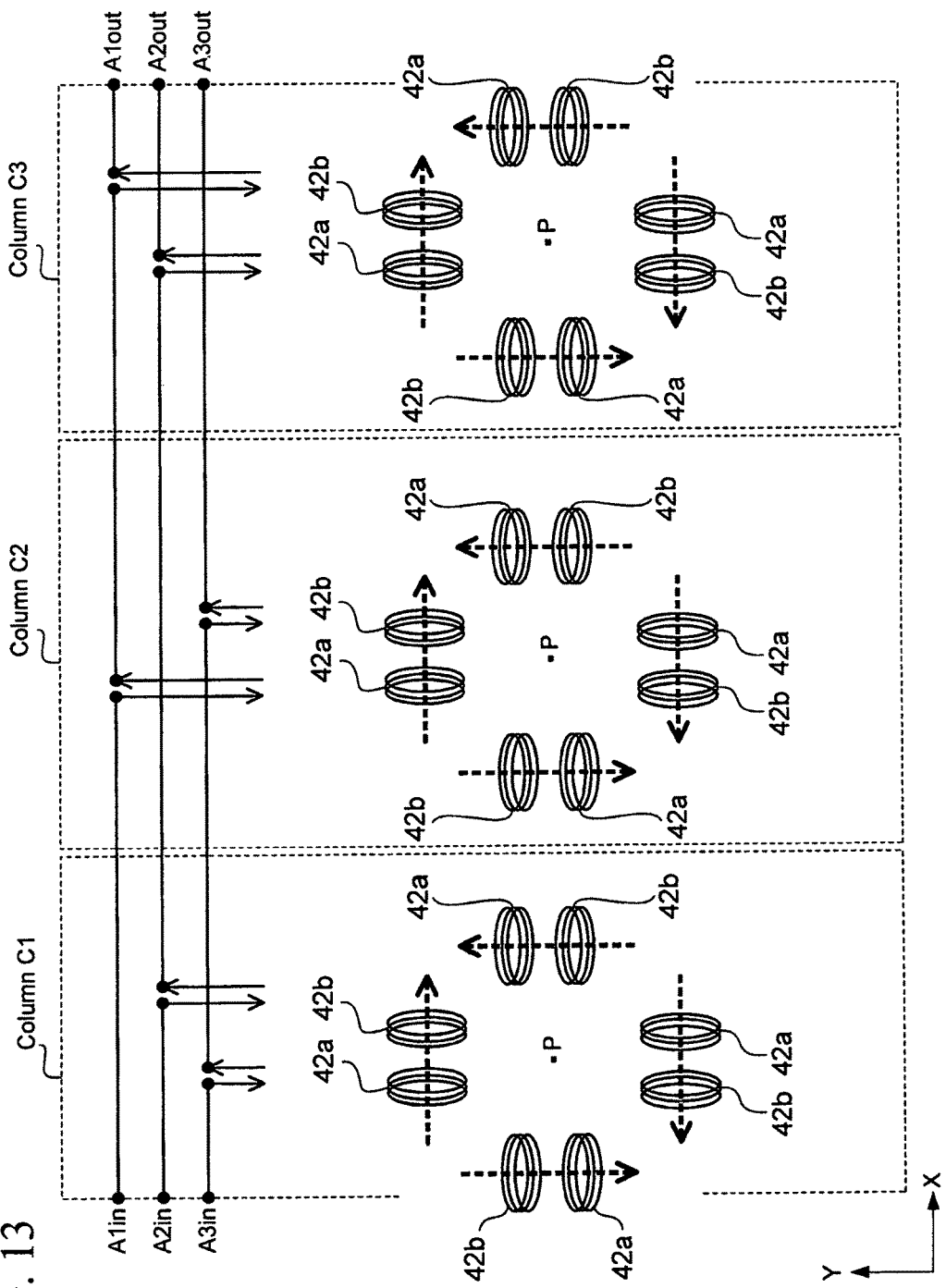
FIG. 13 is a view illustrating the connection of coils 42 of electromagnetic correctors 40 in a column group including three column cells 122.

FIG. 13 illustrates an example of the configuration of the coils 42 in the electromagnetic correctors 40 and the connection for driving the coils 42, in three column cells 122, in other words, a column group including a C1 column, a C2 column, and a C3 column.

Similar to the case of the electromagnetic lenses 50, the electromagnetic correctors 40 which respectively belong to the three column cells 122 are driven by three current source circuits A1, A2, and A3. The current source circuits A1, A2, and A3 respectively include input terminals A1in, A2in, and A3in and output terminals A1out, A2out, and A3out, and a connection section for forming three continuous current paths is provided between adjacent two current source circuits.

The current path formed between the input terminal A1in and the output terminal A1out allows the exciting current to flow to the winding 42a of the electromagnetic corrector 40 in the C2 column, and allows the exciting current to flow to the winding 42b of the electromagnetic corrector 40 in the C3 column.

The current path formed between the input terminal A1in and the output terminal A2out allows the exciting current to flow to the winding 42b of the electromagnetic corrector 40' in the C1 column, and allows the exciting current to flow to the winding 42a of the electromagnetic corrector 40 in the C3 column.

The current path formed between the input terminal A3in and the output terminal A3out allows the exciting current to flow to the winding 42a of the electromagnetic corrector 40 in the C1 column, and allows the exciting current to flow to the winding 42b of the electromagnetic corrector 40 in the C2 column.

In other words, the electromagnetic correctors 40 which respectively belong to the C1 column, the C2 column and the C3 column select and use two independent series from the three current paths as the exciting current.

FIG. 13 illustrates the relation in the foregoing by arrows between the current paths which are formed between the input terminals and the output terminals and the electromagnetic correctors 40.

The example of the electromagnetic correctors 40 in the three column cells 122 illustrated in FIG. 13 has the configuration of the coil and the connection for driving the coil similar to those in the example of the electromagnetic lens 50 which is already explained using FIG. 5.

In the electromagnetic corrector 40, the divided windings in the coil can be driven with the plurality of independent current source circuits similar to those explained in the electromagnetic lens 50.

Other Embodiment

The electromagnetic deflector 30 (see FIG. 3) may have examples of the configuration and the connection similar to those of the electromagnetic corrector 40 illustrated in FIG. 12A. The electromagnetic deflector 30 which belongs to each column cell 122 includes a magnetic material ring, overhang parts of the magnetic material, and coils which are wound around four parts of the magnetic material ring. The coil includes divided windings.

In the case of the electromagnetic deflector 30, directions of the exciting current to feed the coils which are wound around the four parts of the magnetic material ring are different from the directions of the exciting current in the electromagnetic corrector 40 of FIG. 12A.

The directions of the exciting current in the electromagnetic deflector 30 are such that the north pole and the south pole are excited to face each other at end portions of the overhang parts of the magnetic material.

Moreover, the electromagnetic deflector 30 generates a magnetic field, in the space through which the electron beam EB passes, the magnetic field being in a direction perpendicular to the −Z direction, the traveling direction of the electron beam EB, and being capable of changing the travelling direction of the electron beam EB as a whole.

However, other examples of the configuration and the connection of the magnetic material yoke and the coil may be similar to those in the electromagnetic corrector 40. In other words, also in the electromagnetic deflector 30, the divided windings in the coil can be driven with the plurality of independent current source circuits similar to those explained in the electromagnetic lens 50.

Moreover, in the foregoing, the present invention is explained using the embodiments. However, the technical scope of the present invention is not limited to the scope described in the abovementioned embodiments. It is apparent for those skilled in the art that various changes and modifications can be made to the abovementioned embodiments. It is also apparent from the scope of the claims that the embodiments subjected to such changes and modifications can be included in the technical scope of the invention.

It should be noted that the execution order of the processes such as operations, procedures, steps, and stages in an apparatus, a system, a program, and a method indicated in the claims, the description, or the diagrams can be implemented in any order as long as the order is not indicated by "prior to," "before," or the like and as long as the output from a previous process is not used in a later process. Even if descriptions on the operation flows are given in the claims, the description, or the diagrams with use of a word such as "first" or "next" for convenience, this does not mean that the operation is required to be executed in this order.

What is claimed is:

1. A multi column device comprising:
   a plurality of column cells configured to generate charged particle beams;
   electromagnetic elements provided in the respective column cells;
   coils provided in the respective column cells and wherein each coil includes a plurality of divided windings configured to excite the corresponding electromagnetic element; and
   wiring connecting different current source circuits to the respective divided windings belonging to one of the coils, wherein the windings of each of the coils includes a winding not to excite the electromagnetic element.

2. The multicolumn device according to claim 1, wherein the wiring includes a connection section to respectively connect the divided windings of the coil to the divided windings of the coil belonging to an adjacent one of the column cells.

3. The multicolumn device according to claim 1, wherein the current source circuit is shared by the windings belonging to different column cells.

4. The multicolumn device according to claim 1, wherein in two column cells in which the windings of the coils are connected with a connection section sandwiched therebetween, a current passing through a portion of the windings of the coil belonging to one of the two column cells flows through a corresponding portion of the windings of the coil belonging to the other column cell.

5. A multicolumn device, comprising:
   a plurality of column cells configured to generate charged particle beams;
   electromagnetic elements provided in the respective column cells;
   coils provided in the respective column cells and wherein each coil includes a plurality of divided windings configured to excite the corresponding electromagnetic element: and
   wiring connecting different current source circuits to the respective divided windings belonging to one of the coils, wherein a column group including three to ten column cells is formed, the windings of the coils belonging to the respective column cells constituting the column group are successively connected using connection sections to form continuous current paths, and an input terminal and an output terminal are respectively provided at one end and the other end of each of the continuous current paths.

6. The multicolumn device according to claim 5, wherein the number of the column cells constituting the column group is equal to the number of continuous current paths formed in the column group.

7. The multicolumn device according to claim 5, wherein the number of the windings to excite the electromagnetic element in the coil belonging to each of the column cells constituting the column group is less than the number of the column cells constituting the column group.

8. The multicolumn device according to claim 1, wherein the electromagnetic element is any one of an electromagnetic lens, an electromagnetic deflector, and an electromagnetic corrector.

9. A multicolumn charged particle beam exposure apparatus comprising:
   a plurality of column cells configured to generate charged particle beams;

electromagnetic elements provided in the respective column cells;

coils provided in the respective column cells and wherein each coil includes a plurality of divided windings configured to excite the corresponding electromagnetic element;

and wiring connecting different current source circuits to the respective divided windings belonging to one of the coils;

a stage unit on which a sample is to be placed;

a column controller configured to control an operation of the multicolumn device;

and a stage controller configured to control an operation of the stage unit, wherein the windings of each of the coils includes a winding not to excite the electromagnetic element.

10. The multicolumn charged particle beam exposure apparatus according to claim 9, wherein the column controller includes a driving unit provided with the current source circuits the number of which is equal to the number of the column cells constituting the multicolumn device, and each of the current source circuits feeds a current between an input terminal and an output terminal of the continuous current path formed in a column group.

11. The multicolumn charged particle beam exposure apparatus according to claim 10, wherein the driving unit is installed outside a region where the plurality of column cells constituting the multicolumn device are disposed.

* * * * *